United States Patent
Karasawa et al.

(10) Patent No.: US 9,202,781 B2
(45) Date of Patent: Dec. 1, 2015

(54) WIRING SUBSTRATE, METHOD FOR MANUFACTURING WIRING SUBSTRATE, AND SEMICONDUCTOR PACKAGE

(71) Applicant: SHINKO ELECTRIC INDUSTRIES CO., LTD., Nagano (JP)

(72) Inventors: Yuko Karasawa, Nagano (JP); Kazue Ban, Nagano (JP); Ryo Fukasawa, Nagano (JP); Yuichi Matsuda, Nagano (JP); Michio Horiuchi, Nagano (JP); Yasue Tokutake, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 128 days.

(21) Appl. No.: 14/064,360

(22) Filed: Oct. 28, 2013

(65) Prior Publication Data

US 2014/0117539 A1   May 1, 2014

(30) Foreign Application Priority Data

Oct. 29, 2012 (JP) ................. 2012-238317
Jan. 23, 2013 (JP) ................. 2013-010482
Sep. 4, 2013 (JP) ................. 2013-183355

(51) Int. Cl.
| | | |
|---|---|---|
| H01L 23/06 | (2006.01) | |
| H01L 23/48 | (2006.01) | |
| H01L 23/498 | (2006.01) | |
| H01L 23/15 | (2006.01) | |
| H05K 3/46 | (2006.01) | |

(52) U.S. Cl.
CPC .......... *H01L 23/49811* (2013.01); *H01L 23/15* (2013.01); *H01L 23/49816* (2013.01); *H01L 23/49822* (2013.01); *H01L 23/49827* (2013.01); *H05K 3/4605* (2013.01); *H01L 2224/16225* (2013.01); *H05K 3/4661* (2013.01); *H05K 2201/10378* (2013.01); *H05K 2203/0315* (2013.01)

(58) Field of Classification Search
CPC .......... H01L 23/15; H01L 24/29; H01L 24/32
USPC .................. 257/703, 700, 701, 774, E23.011
See application file for complete search history.

(56) References Cited

U.S. PATENT DOCUMENTS

| | | | |
|---|---|---|---|
| 5,627,406 A * | 5/1997 | Pace | 257/700 |
| 6,625,032 B1 * | 9/2003 | Ito et al. | 361/751 |
| 6,867,493 B2 * | 3/2005 | Hashemi et al. | 257/717 |
| 6,921,977 B2 * | 7/2005 | Shimizu | H01L 23/49822 257/701 |

(Continued)

FOREIGN PATENT DOCUMENTS

JP   2010-272562   12/2010

*Primary Examiner* — Nitin Parekh
(74) *Attorney, Agent, or Firm* — IPUSA, PLLC

(57) ABSTRACT

A wiring substrate includes a core layer, first and second wiring layers, and a first insulating layer. The core layer has one and another surfaces and includes a plate-shaped member formed of an aluminum oxide and multiple linear conductors penetrating the plate-shaped member in a thickness direction of the plate-shaped member. The first wiring layer is formed on the one surface of the core layer. The second wiring layer is formed on the other surface of the core layer. The first insulating layer has a same thickness as the first wiring layer and is formed in an area of the one surface of the core layer on which the first wiring layer is not formed. The first and second wiring layers are positioned superposing each other in a plan view. The first and second wiring layers are electrically connected by way of the multiple linear conductors.

11 Claims, 24 Drawing Sheets

(56) References Cited

U.S. PATENT DOCUMENTS

| | | | |
|---|---|---|---|
| 7,042,083 B2* | 5/2006 | Sugizaki | H01L 23/49816 257/701 |
| 7,226,654 B2* | 6/2007 | Kawai | B32B 7/04 174/255 |
| 7,535,095 B1* | 5/2009 | En et al. | 257/701 |
| 2001/0008309 A1* | 7/2001 | Iijima et al. | 257/737 |
| 2003/0205804 A1* | 11/2003 | Lee et al. | 257/703 |
| 2004/0212075 A1* | 10/2004 | Shiraishi et al. | 257/700 |
| 2008/0217784 A1* | 9/2008 | Binder et al. | 257/762 |
| 2010/0294552 A1 | 11/2010 | Kobayashi et al. | |

* cited by examiner

WIRING SUBSTRATE, METHOD FOR MANUFACTURING WIRING SUBSTRATE, AND SEMICONDUCTOR PACKAGE

CROSS-REFERENCE TO RELATED APPLICATIONS

This application is based upon and claims the benefit of priority of the prior Japanese Patent Application Nos. 2012-238317, 2013-010482, 2013-183355 filed on Oct. 29, 2012, Jan. 23, 2013, Sep. 4, 2013, respectively, the entire contents of which are incorporated herein by reference.

FIELD

The embodiments discussed herein are related to a wiring substrate, a method for manufacturing the wiring substrate, and a semiconductor package.

BACKGROUND

As a known substrate used as an interposer (hereinafter also referred to as "interposer substrate"), there is an insulating base material having multiple linear conductors penetrating the insulating base material in a thickness direction of the insulating base material. Each linear conductor has one end exposed in one surface of the insulating base material and another end exposed in the other surface of the insulating base material. In the interposer substrate, pads are formed opposing each other on the one and the other surfaces of the insulating base material. The pads formed on the one and the other surfaces of the insulating base material are electrically connected to each other by way of the linear conductor. This interposer substrate may have a semiconductor chip mounted thereon (see, for example, Japanese Laid-Open Patent Publication No. 2010-272562).

As described above, the interposer substrate has pads formed opposite to each other, on the one and the other surfaces of the insulating base material. However, in reality, it is difficult to form pads positioned exactly opposite to each other on the one and the other surfaces of the insulating base material due to inconsistent manufacturing. Accordingly, it becomes necessary to take position deviation between the pads into consideration when designing the interposer substrate. Thus, the narrowing of the pitch between the pads becomes limited.

Accordingly, as the narrowing of the pitch between the electrode pads of a semiconductor chip progresses, it becomes difficult to mount the semiconductor chip on the interposer substrate.

SUMMARY

According to an aspect of the invention, there is provided a wiring substrate includes a core layer, first and second wiring layers, and a first insulating layer. The core layer has one and another surfaces and includes a plate-shaped member formed of an aluminum oxide and multiple linear conductors penetrating the plate-shaped member in a thickness direction of the plate-shaped member. The first wiring layer is formed on the one surface of the core layer. The second wiring layer is formed on the other surface of the core layer. The first insulating layer has a same thickness as the first wiring layer and is formed in an area of the one surface of the core layer on which the first wiring layer is not formed. The first and second wiring layers are positioned superposing each other in a plan view. The first and second wiring layers are electrically connected by way of the multiple linear conductors.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
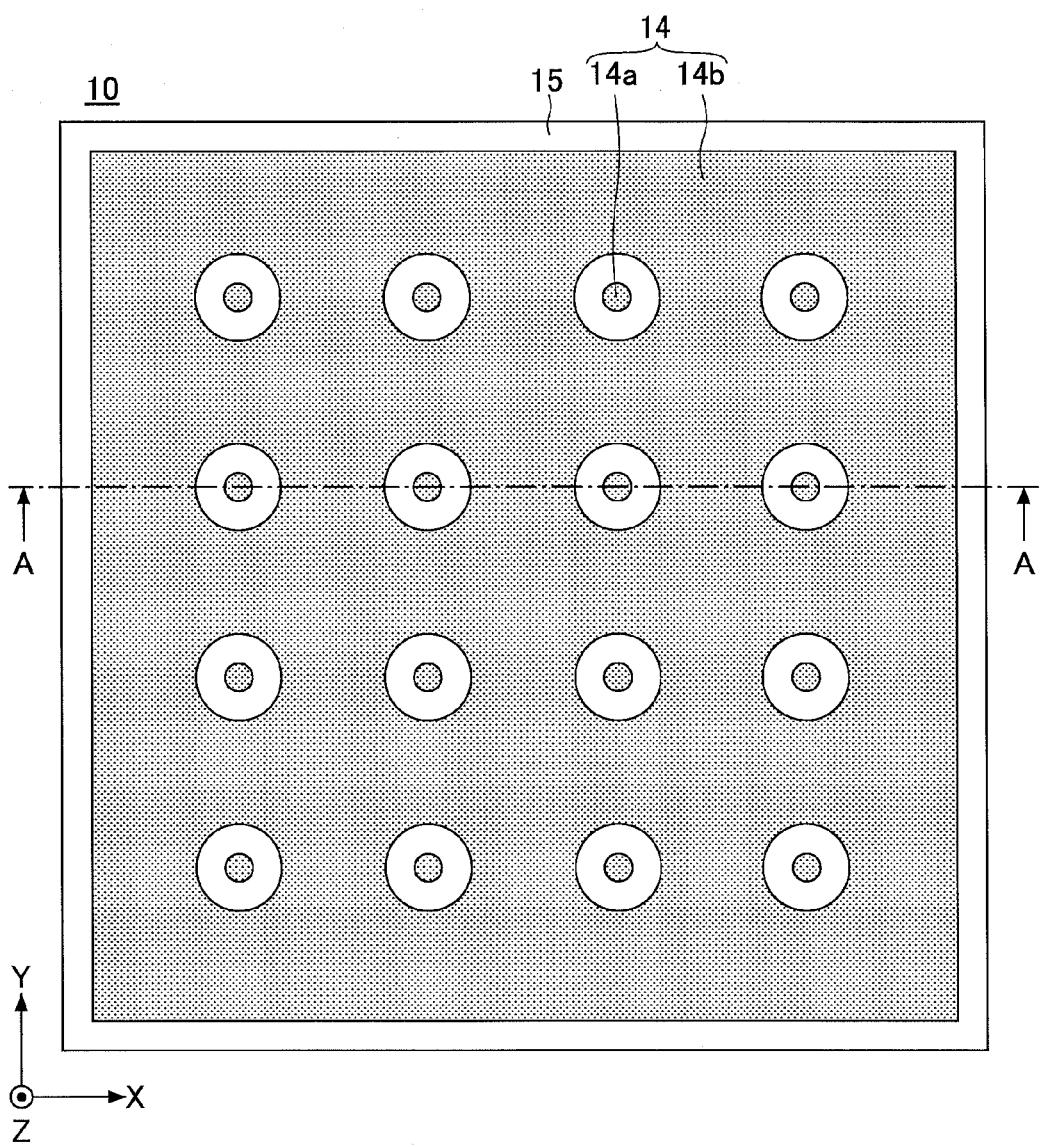
FIGS. 1A and 1B are schematic diagrams illustrating a wiring substrate according to a first embodiment of the present invention.

Next, embodiments of the present invention are described with reference to the accompanying drawings. Throughout the drawings, like components/parts are denoted with like reference numerals. Thus, detailed descriptions of like components/parts denoted with like reference numerals are omitted.

First Embodiment

Structure of Wiring Substrate of First Embodiment

Figure 1B:
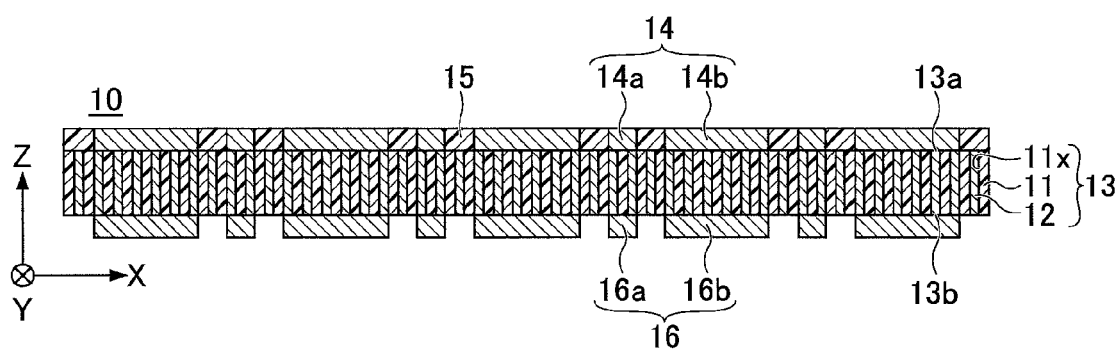

First, a structure of a wiring substrate 10 according to a first embodiment of the present invention is described. FIGS. 1A and 1B are diagrams illustrating the wiring substrate 10 of the first embodiment. FIG. 1A is a plan view of the wiring substrate 10. FIG. 1B is a cross-sectional view of the wiring substrate 10 taken along line A-A of FIG. 1A. In FIGS. 1A-1B, the X-direction is a direction that is parallel to one surface 13a of a below-described core layer 13, the Y-direction is a direction that is orthogonal to the X-direction (depth direction of the drawings), and the Z-direction is a direction that is orthogonal to both the X and Y directions (thickness direction of the core layer 13). In describing the wiring substrate 10, for the sake of convenience, the term "upper side" or the term "upper surface" may be used to indicate a side or a surface that is positioned toward the one surface 13a of the core layer 13, and the term "lower side" or the term "lower surface" may be used to indicate a side or surface that is positioned toward the below-described other surface 13b of the core layer 13.

As illustrated in FIGS. 1A and 1B, the wiring substrate 10 includes, for example, the core layer 13, a first wiring layer 14, a first insulating layer 15, and a second wiring layer 16. The core layer 13 is a flat material that is used as a base material on which layers such as the first wiring layer 15 are formed. The core layer 13 may have, for example, a rectangular shape from a plan view (plan-view shape). In a case where the plan-view shape of the core layer 13 is a rectangular shape, the width (X-direction) of the core layer 13 may be, for example, approximately 200 mm and the depth (Y-direction) may be, for example, approximately 200 mm (approx. 200 mm×200 mm). The thickness (Z-direction) of the core layer 13 may be, for example, approximately 70 μm to 100 μm. It is, however, to be noted that the plan-view shape of the core layer 13 is not limited to a rectangular shape. For example, the plan-view shape of the core layer 13 may be a circular shape.

The core layer 13 includes a plate-shaped member 11 formed of aluminum oxide and multiple linear conductors (vias) 12 penetrating the plate-shaped member 11 in its thickness direction. Multiple through-holes 11x that penetrate the plate-shaped member 11 in the Z-direction (thickness direction) of the plate-shaped member 11 are formed throughout the entire plate-shaped member 11. The multiple linear conductors 12 are formed by filling the multiple through-holes 11x with a metal material.

Each of the linear conductors 12 has one end surface (upper end surface) exposed from the one surface 13a of the core layer 13 and another end surface (lower end surface) exposed from the other surface 13b of the core layer 13b. The linear conductors 12, which are formed substantially throughout the entire surface of the plate-shaped member 11, are arranged substantially parallel to each other at substantially equal intervals. The plan-view shape of each of the linear conductors 12 is, for example, a circular shape. The diameter of the linear conductor 12 may be, for example, approximately 0.1 μm to 1 μm. It is, however, to be noted that the circular shape of the linear conductor 12 is not limited to a perfect circle but may include a substantially circular shape. It is also to be noted that the plan-view shape is a shape that is obtained when observing an object from the Z-direction in FIGS. 1A-1B.

It is preferable for the linear conductors 12 to be densely arranged, so that the interval between the linear conductors 12 is smaller than the diameter of a single linear conductor 12. For example, the density of the linear conductors 12 may be not less than $4 \times 10^6$ conductors/mm$^2$ and not greater than $1 \times 10^{10}$ conductors/mm$^2$. The arrangement of the linear conductors 12 is not limited to a particular shape. For example, the linear conductors 12 may be arranged to form a hexagonal shape. Alternatively, the linear conductors 12 may be arranged as a grid-like shape. The metal material used for forming the linear conductors 12 may be, for example, silver (Ag), copper (Cu), or nickel (Ni).

The first wiring layer 14 is formed on the one surface 13a of the core layer 13. The first wiring layer 14 includes signal wirings 14a that transmit signals therethrough and solid wirings 14b that are formed surrounding the signal wirings 14a at predetermined intervals. Each of the signal wirings 14a and the solid wirings 14b is electrically connected to a corresponding linear conductor 12.

For example, copper (Cu) may be used as the material of the first wiring layer 14. The thickness of the first wiring layer 14 may be, for example, approximately 3 μm to 8 μm. The signal wirings 14a may be arranged to form, for example, a hexagonal shape or a grid-like shape. The pitch between the signal wirings 14a may be, for example, approximately 50 μm. For the sake of convenience, the first wiring layer 14 is illustrated with a satin pattern in FIG. 1A.

The first insulating layer 15 is formed in an area(s) of the one surface 13a of the core layer 13 where the first wiring layer 14 is not formed. For example, an epoxy type resin or an insulating resin having BCB (benzocyclobutene) as its main component may be used as the material of the first insulating layer 15. The thickness of the first insulating layer 15 is the same as the thickness of the first wiring layer 14. In other words, an upper surface of the first insulating layer 15 is substantially flush with an upper surface of the first wiring layer 14 (upper surfaces of the signal wirings 14a and the sold wirings 14b). Thus, the upper surface of the first insulating layer 15 and the upper surface of the first wiring layer 14, as a whole, form a flat surface.

Because the upper surface of the first insulating layer 15 and the upper surface of the first wiring layer 14 together form a flat surface, a fine-patterned wiring layer(s) can be easily formed on the first insulating layer 15 and the first wiring layer 14.

The second wiring layer 16 is formed on the other surface 13b of the core layer 13. The second wiring layer 16 includes signal wirings 16a that transmit signals therethrough and solid wirings 16b that are formed surrounding the signal wirings 16a at predetermined intervals. Each of the signal wirings 16a and the solid wirings 16b is electrically connected to a corresponding linear conductor 12.

For example, copper (Cu) may be used as the material of the second wiring layer 16. The thickness of the second wiring layer 16 may be, for example, approximately 3 μm to 8 μm. The signal wirings 16a may be arranged to form, for example, a hexagonal shape or a grid-like shape. The pitch between the signal wirings 16a may be, for example, approximately 50 μm.

The signal wirings 14a and the signal wirings 16a are positioned to superpose each other from a plan view. The signal wirings 14a and the signal wirings 16a are electrically connected to each other by way of the linear conductors 12.

Among the linear conductors 12, the liner conductor 12, which has one end exposed at the one surface 13a of the core layer 13 and contacting the signal wiring 14a of the first wiring layer 14, has another end that always contacts the signal wiring 16a of the second wiring layer 16. Further, among the linear conductors 12, the linear conductor 12, which has one end exposed at the one surface 13a of the core layer 13 and contacting the solid wiring 14b of the first wiring layer 14, has another end that always contacts the solid wiring 16b of the second wiring layer 16.

Accordingly, with the wiring substrate 10 of the first embodiment, the first wiring layer 14 formed on the one surface 13a of the core layer 13 and the second wiring layer 16 formed on the other surface 13b of the core layer 13 are substantially perfectly superposed from a plan view. Thus, position deviation between the first and second wiring layers 14, 16 does not need to be taken into consideration. Therefore, compared to a conventional art case, the first and second wiring layers 14, 16 can be formed with a narrower pitch (finer pattern). This effect can be attained by performing the below-described manufacturing processes (see, for example, the process illustrated in FIG. 3B).

The solid wirings 14b, 16b are connected to, for example, ground (GND) wirings. Thereby, the signal wirings 14a, 16a, a portion of the linear conductors 12 connecting the signal wirings 14a, 16a, the solid wirings 14b, 16b surrounding the signal wirings 14a, 16a, and another portion of the linear conductors 12 connecting the solid wirings 14b, 16b constitute a configuration that is equivalent to a coaxial line. As a result, a shield effect can be attained by this configuration. That is, the signal wirings 14a, 16a and the portion of the linear conductors 12a connecting the signal wirings 14a, 16a can be shielded from external noise.

Further, the solid wirings 14b, 16b and the other portion of the linear conductors 12 connecting the solid wirings 14b, 16b are positioned between the adjacently arranged signal wirings 14a, 16a and the portion of the linear conductors 12 connecting the signal wirings 14a, 16a. Thereby, electrical coupling (capacity coupling) generated between the adjacently arranged signal wirings 14a, 16a and the other portion of the linear conductors 12 connecting the signal wirings 14a, 16a can be reduced. As a result, the signal wirings 14a, 16a and the portion of the linear conductors 12 connecting the signal wirings 14a, 16a can be prevented from becoming a noise source.

Method for Manufacturing Wiring Substrate of First Embodiment

Next, a method for manufacturing a wiring substrate according to a first embodiment of the present invention is described. FIGS. 2A-3C are schematic diagrams illustrating processes of the method for manufacturing a wiring substrate according to the first embodiment of the present invention.

Figure 2A:
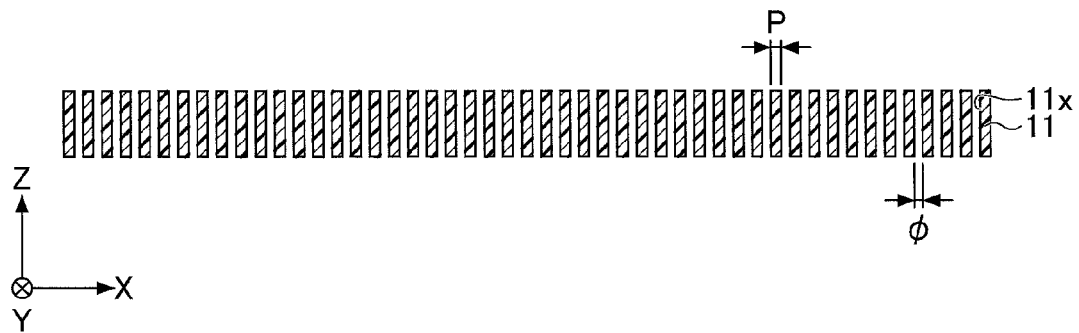
FIGS. 2A-2C are schematic diagrams illustrating processes for manufacturing the wiring substrate according to the first embodiment of the present invention (part 1)

First, in the process illustrated in FIG. 2A, a flat plate formed of aluminum (Al) is prepared. By performing an anodic oxidation process on the flat plate, the plate-shaped member 11 formed of aluminum oxide is obtained along with many through-holes 11x formed in the plate-shaped member 11. The plan-view shape of the plate-shaped member 11 may be, for example, a rectangular shape. In a case where the plan-view shape of the plate-shaped member 11 is a rectangular shape, the width (X-direction) of the plate-shaped member 11 may be, for example, approximately 200 mm, and the depth (Y-direction) of the plate-shaped member 11 may be, for example, approximately 200 mm. The thickness (Z-direction) of the plate-shaped member 11 may be, for example, approximately 70 μm to 100 μm. It is, however, to be noted that the plan-view shape of the plate-shaped member 11 is not limited to a rectangular shape. For example, the plan-view shape of the plate-shaped member 11 may be a circular shape.

The plan-view shape of the through-hole 11x may be, for example, a circular shape. In a case where the plan-view of the through-hole 11x is a circular shape, the diameter of the through-hole 11x may be, for example, approximately 0.1 μm to 1 μm. It is preferable for the through-holes 11x to be densely arranged, so that an interval P between adjacent through-holes 11x is smaller than the diameter φ of a single through-hole 11x. However, the arrangement of the through-holes 11x is not limited to a particular shape. For example, the through-holes 11x may be arranged to form a hexagonal shape or a grid-like shape.

The anodic oxidation process is a method that is performed by immersing an aluminum (Al) flat plate as an anode into an electrolyte (preferably, sulfuric acid aqueous solution), placing an electrode (e.g., platinum (Pt)) as a cathode opposite to the aluminum flat plate, and energizing (applying pulse voltage to) the electrode. Thereby, an aluminum oxide plate-shaped member 11 having many through-holes 11x formed therein (anodic aluminum oxide film) can be obtained.

Figure 2B:
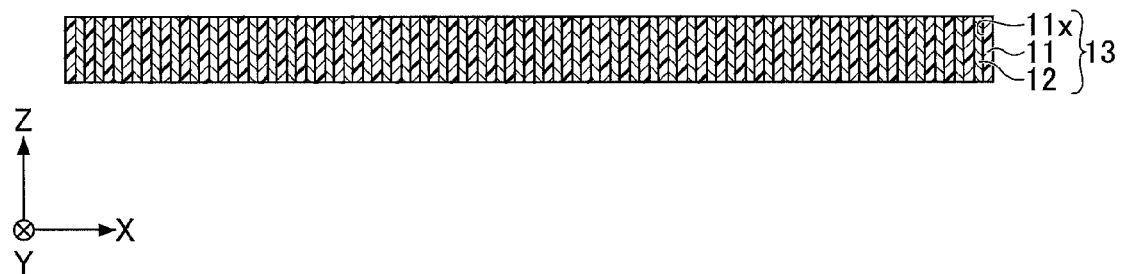

Then, in the process illustrated in FIG. 2B, the linear conductors 12 are formed by filling the through-holes 11x formed in the plate-shaped member 11 with a metal material. Thereby, the core layer 13 including the aluminum oxide plate-shaped member 11 and multiple linear conductors 12 penetrating the plate-shaped member 11 in its thickness direction can be obtained. The linear conductors 12 may be formed by using, for example, a screen-printing method or an inkjet method and filling the through-holes 11x with a conductive paste such as silver (Ag) or copper (Cu).

According to necessity, both surfaces of the plate-shaped member 11 may be planarized by using a polishing method such as mechanical polishing or chemical mechanical polishing (CMP). Thereby, both end surfaces of the linear conductors 12 can be exposed from both surfaces of the plate-shaped member 11. As a result, the core layer 13 can be manufactured, so that the linear conductors 12 having fine diameters and penetrating the plate-shaped member 11 in the thickness direction of the plate-shaped member 11 can be arranged with high density in the core layer 13.

Figure 2C:
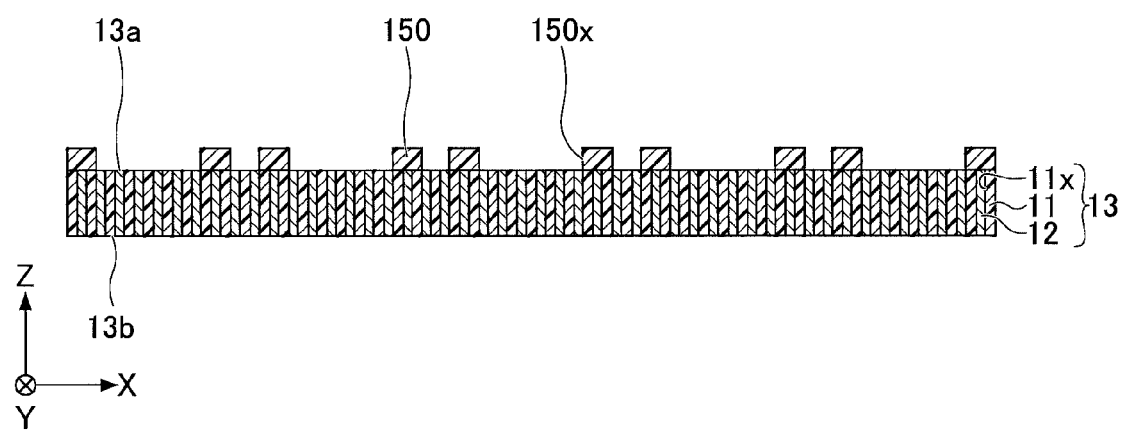

Then, in the process illustrated in FIG. 2C, a resist layer 150 is formed on the one surface 13a of the core layer 13. The resist layer 150 includes an opening part(s) 150x that exposes an area of the one surface 13a of the core layer 13 on which the first wiring layer 14 is to be formed (see, FIGS. 1A and 1B). The resist layer 150 is a layer that eventually becomes the first insulating layer 15 by polishing an upper surface of the resist layer 150. The thickness of the resist layer 150 may be, for example, approximately 20 μm to 50 μm.

More specifically, a liquid or paste-like photosensitive resist is applied on the one surface 13a of the core layer 13. Alternatively, a film-like photosensitive resist (e.g., dry-film resist) may be laminated on the one surface 13a of the core layer 13. Then, the opening parts 150x are formed by exposing and developing the resist applied or laminated on the one surface 13a of the core layer 13. Thereby, the resist layer 150 including the opening parts 150x is formed.

Alternatively, a film-like resist that is already formed with the opening parts 150x may be laminated on the one surface 13a of the core layer 13. Alternatively, a non-photosensitive resist may be used. In a case of using the non-photosensitive resist, the opening parts 150x may be formed by, for example, a laser processing method.

Figure 3A:
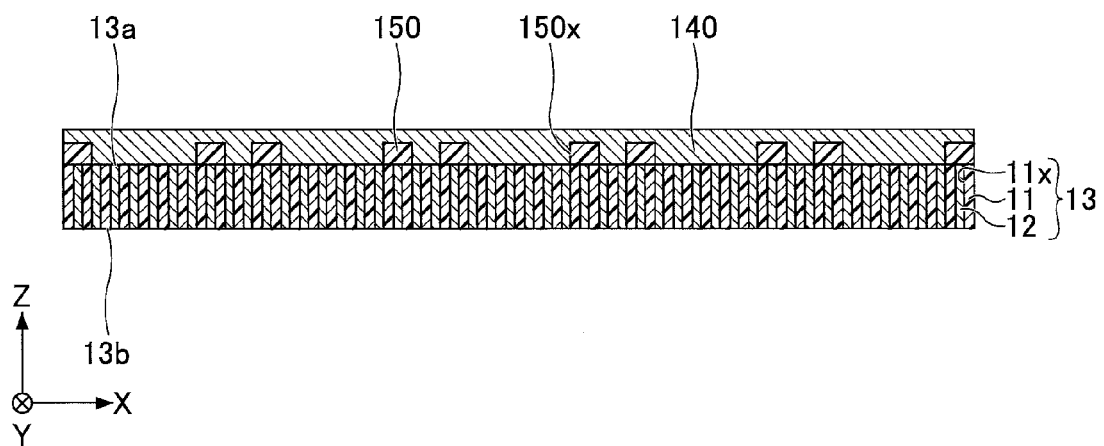
FIGS. 3A-3C are schematic diagrams illustrating processes for manufacturing the wiring substrate according to the first embodiment of the present invention (part 2)

Then, in the process illustrated in FIG. 3A, a metal layer 140 that covers the one surface 13a of the core layer 13 (including the resist layer 150 formed on the one surface 13a of the core layer 13) is formed. In other words, the metal layer 140 is formed on the one surface 13a of the core layer 13 exposed in the opening parts 150x and an upper surface of the resist layer 150.

More specifically, a seed layer (not illustrated) is continuously formed on the one surface 13a of the core layer 13 exposed in the opening parts 150x, and the upper and side surfaces of the resist layer 150 by using, for example, a sputtering method or an electroless plating method. Then, the metal layer 140 is formed on the seed layer by performing an electroplating method using the seed layer as a power-feeding layer, so that the metal layer 140 covers the entire one surface 13a of the core layer 13 including the resist layer 150.

For example, copper (Cu) may be used as the material of the seed layer and the metal layer 140. The seed layer may include a layer other than a layer formed of copper (Cu) in view of the adhesiveness (bond) with respect to, for example, the core layer 13. The metal layer 140 is a layer that eventually becomes the first wiring layer 14 by removing unnecessary parts from the metal layer 140.

Alternatively, the metal layer 140 may be formed by the following method. First, a power-feeding plate (not illustrated) formed of copper (Cu) is prepared. The core layer 13 is placed on an upper surface of the power-feeding plate (not illustrated), so that the upper surface of the power-feeding plate (not illustrated) faces the other surface 13b of the core layer 13 and contacts the end surfaces of the linear conductors 12 exposed from the other surface 13b of the core layer 13.

Then, a plating film deposited on the one surface 13a of the core layer 13 is grown by an electroplating method using the power-feeding plate (not illustrated) and the linear conductors 12 as a power-feeding path. Thereby, the metal layer 140, which covers the entire one surface 13a of the core layer 13 including the resist layer 150, is formed. Then, the core layer 13 is removed from the power-feeding plate (not illustrated).

Figure 3B:
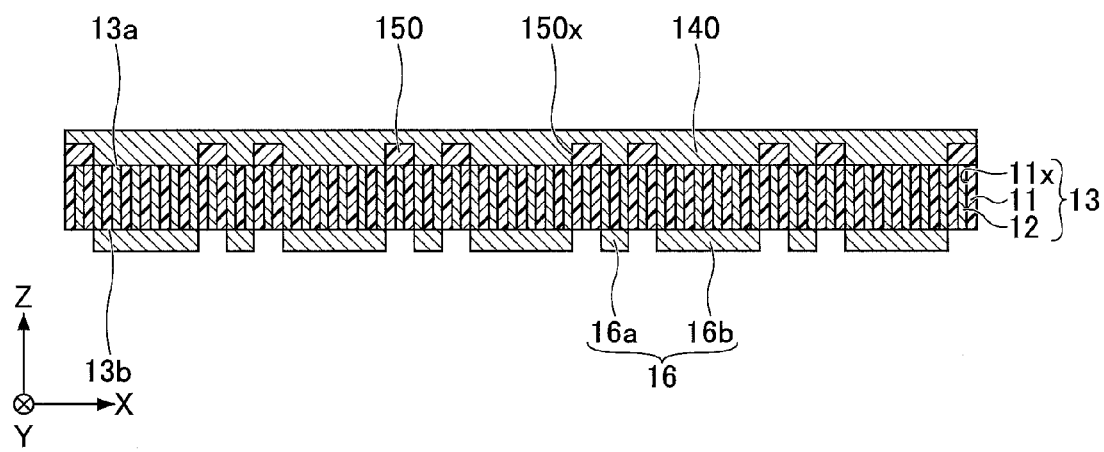

Then, in the process illustrated in FIG. 3B, the second wiring layer 16 is formed in areas of the other surface 13b of the core layer 13 that superpose the opening parts 150x from a plan view. More specifically, a plating film deposited on the other surface 13b of the core layer 13 is grown by an electroplating method using the metal layer 14 and the liner conductors 12 connected to the metal layer 14 as a power-feeding path. Thereby, the second wiring layer 16 is formed in areas of the other surface 13b of the core layer 13 that superpose the opening parts 150x from a plan view. According to necessity, a lower surface of the second wiring layer 16 may be planarized by, for example, polishing the lower surface of the second wiring layer 16.

The second wiring layer 16 is formed by growing the plating film only from other ends of the linear conductors 12 that have one ends electrically connected to the metal layer 140 formed in the opening parts 150x. As a result, the second wiring layer 16 can be formed in positions that are accurately superposed with the metal layer 140 in the opening parts 150x from a plan view. As described above, the second wiring layer 16 is formed to include the signal wirings 16a and the solid wirings 16b surrounding the signal wirings 16a at predetermined intervals.

Figure 3C:
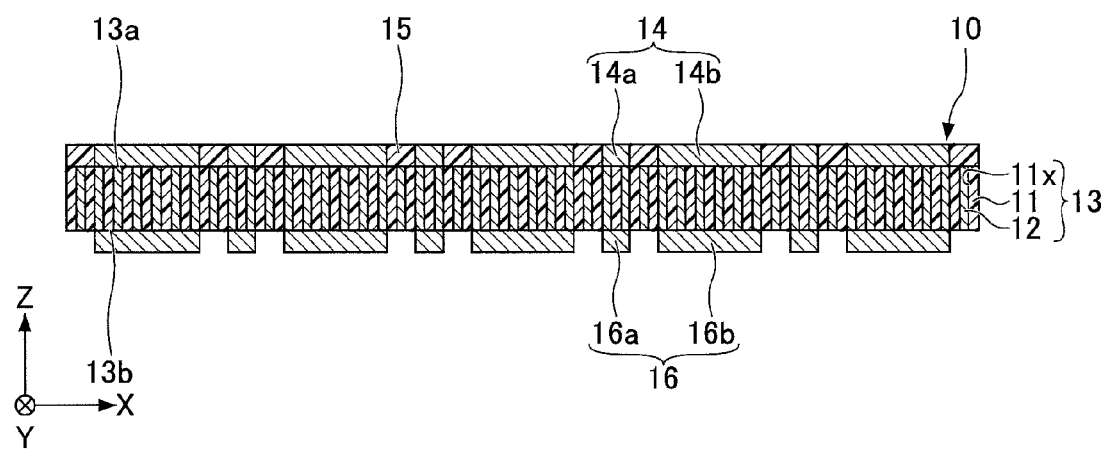

Then, in the process illustrated in FIG. 3C, the upper surface of the metal layer 140 is polished (e.g., chemical mechanical polishing (CMP)) until the upper surface of the resist layer 150 becomes exposed. Thereby, the metal layer 140 becomes the first wiring layer 14, and the resist layer 150 becomes the first insulating layer 15. During this process, a portion of the upper surface of the resist layer 150 may also be polished. As a result, the first wiring layer 14, which includes the signal wirings 14a and the solid wirings 14b surrounding the signal wirings 14a at predetermined intervals, is formed. In addition, at the same time of forming the first wiring layer 14, the first insulating layer 15 is also formed on areas of the one surface 13a of the core layer 13 where the first wiring layer 14 is not formed. The first insulating layer 15 is formed to have the same thickness as the first wiring layer 14.

Next, a wiring substrate 100 according to a comparative example is described for explaining the effects that can be attained by the wiring substrate 10 according to an embodiment of the present invention. In the wiring substrate 100 of the comparative example, the first and second wiring layers 14, 16 are formed by using, for example, a sputtering method. At a glance, the wiring substrate 100 may appear to be similar to the wiring substrate 10 of FIGS. 1A and 1B in which the wiring substrate 100 includes the first wiring layer 14 and the second wiring layer 16 formed in a position superposing the first wiring layer 14 from a plan view.

Figure 4:
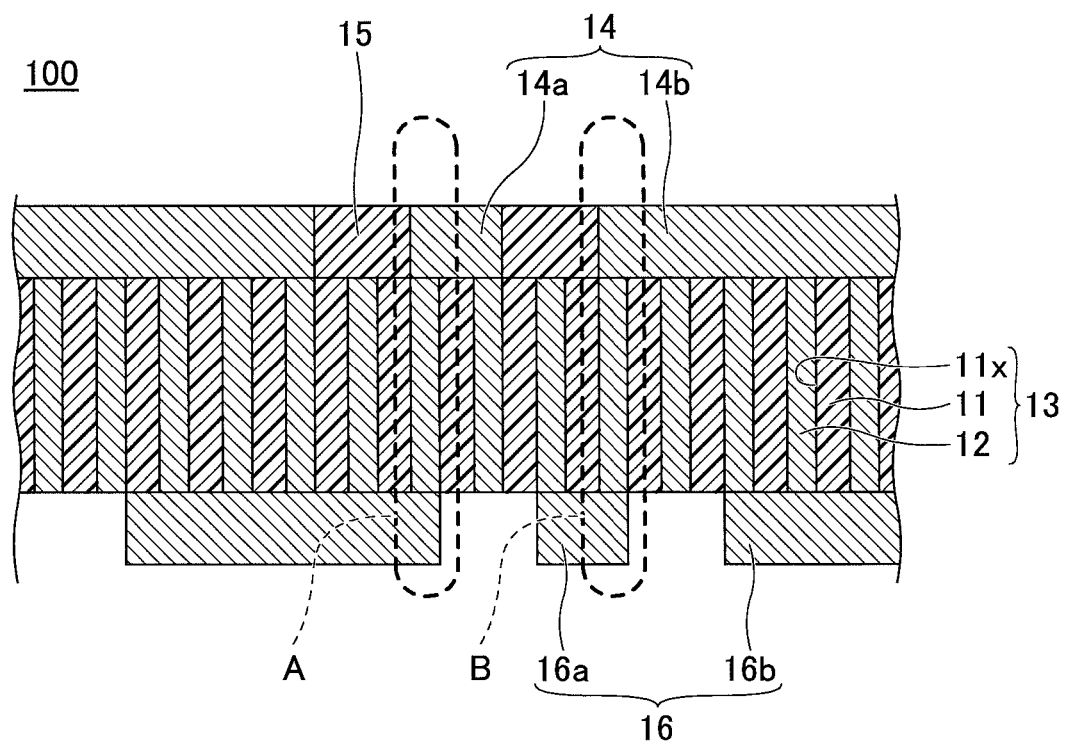
FIG. 4 is an enlarged cross-sectional view illustrating a portion of a wiring substrate according to a comparative example.

However, as illustrated in FIG. 4 showing an enlarged view of the vicinity of the first and second wiring layers 14, 16, the position of the second wiring layer 16 deviates from the position of the first wiring layer 14 even in a case of attempting to form the second wiring layer 16 in a position superposing the position of the first wiring layer 14 from a plan view. This position deviation is due to inconsistency during manufacturing of the wiring substrate 100. Generally, the position of the second wiring layer 16 deviates at least approximately 10 μm from the position of the first wiring layer 14. It is to be noted that FIG. 4 is a partial enlarged cross-sectional view of the wiring substrate 100 according to the comparative example.

Because the linear conductors 12 are arranged with extreme density, portions of the first and second wiring layers 14, 16 that are not initially intended to be electrically connected (conducted) by way of the linear conductors 12 may be electrically connected (conducted) in a case where position deviation occurs between the first and second wiring layers 14, 16. As a result, connection reliability of the wiring substrate 100 may be degraded. For example, in the example illustrated in FIG. 4, portions A and B of the wiring substrate 100 that are not intended to be electrically connected are electrically connected by way of the linear conductors 12.

More specifically, in the portion A of the wiring substrate 100, the signal wiring 14a, which is not intended to electrically connect with the solid wiring 16b, electrically connects with the solid wiring 16b. Further, in the portion B of the wiring substrate 100, the solid wiring 14b, which is not intended to electrically connected with the signal wiring 16a, electrically connects with the signal wiring 16a. This problem of unintended electric connection (conduction) occurs more easily as the pitches of the first and second wiring layers 14, 16 are reduced (i.e. as the density of the first and second wiring layers 14, 16 increases). In other words, with the wiring substrate 100 of the comparative example, connection reliability cannot be maintained unless the wiring substrate 100 is designed by taking the position deviation between the first and second wiring layers 14, 16 into consideration. Thus, with the wiring substrate 100 of the comparative example, it is difficult to reduce the pitches of the first and second wiring layers 14, 16.

With the above-described embodiment of the present invention, the second wiring layer 16 can be formed by growing a plating film on the other surface 13b of the core layer 13 by an electroplating method using the metal layer 140 and the linear conductors 12 as the power-feeding path (see, for example, description of the process illustrated in FIG. 3B). Accordingly, the second wiring layer 16 can be extremely accurately formed in a position superposed with the first wiring layer 14 (metal layer 140 in the opening parts 150x) from a plan view.

Figure 5:
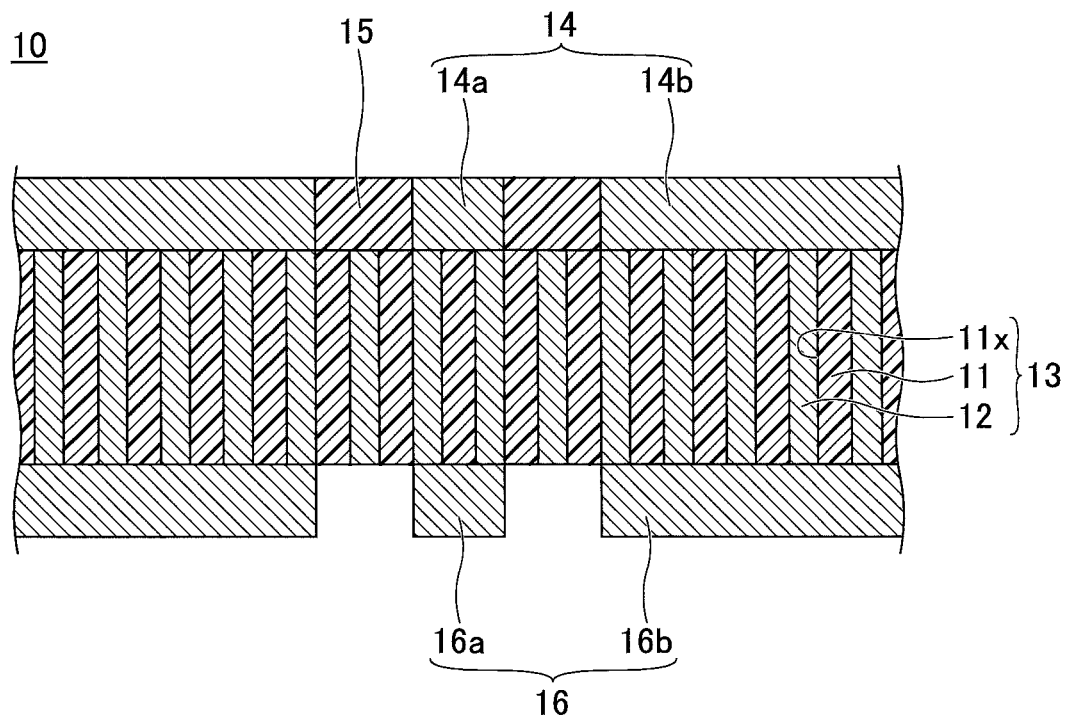
FIG. 5 is an enlarged cross-sectional view illustrating a portion of the wiring substrate of FIG. 1.

As a result, as illustrated in FIG. 5, position deviation of the second wiring layer 16 with respect to the first wiring layer 14 can be substantially zero. Thus, the risk of portions of the first and second wiring layers 14, 16 being unintentionally connected by the linear conductors 12 can be reduced, and connection reliability of the wiring substrate 10 can be improved. Hence, with the wiring substrate 10 according to the above-described embodiment, the pitches of the first and second wiring layers 14, 16 can be reduced while maintaining connection reliability of the wiring substrate 10. It is to be noted that FIG. 5 is a partial enlarged cross-sectional view of the wiring substrate 10 of FIGS. 1A and 1B.

Second Embodiment

A second embodiment of the present invention illustrates an example of a wiring substrate 20 having multiple layers such as an insulating layer and a wiring layer formed on both surfaces of the wiring substrate 10 of the first embodiment. Further, the second embodiment of the present invention also illustrates an example of a semiconductor package 30 having a semiconductor chip 32 mounted on the wiring substrate 20. In the second embodiment, like components are denoted with like reference numerals as those of the first embodiment and are not further explained.

Structure of Wiring Substrate and Semiconductor Package of Second Embodiment

Figure 6:
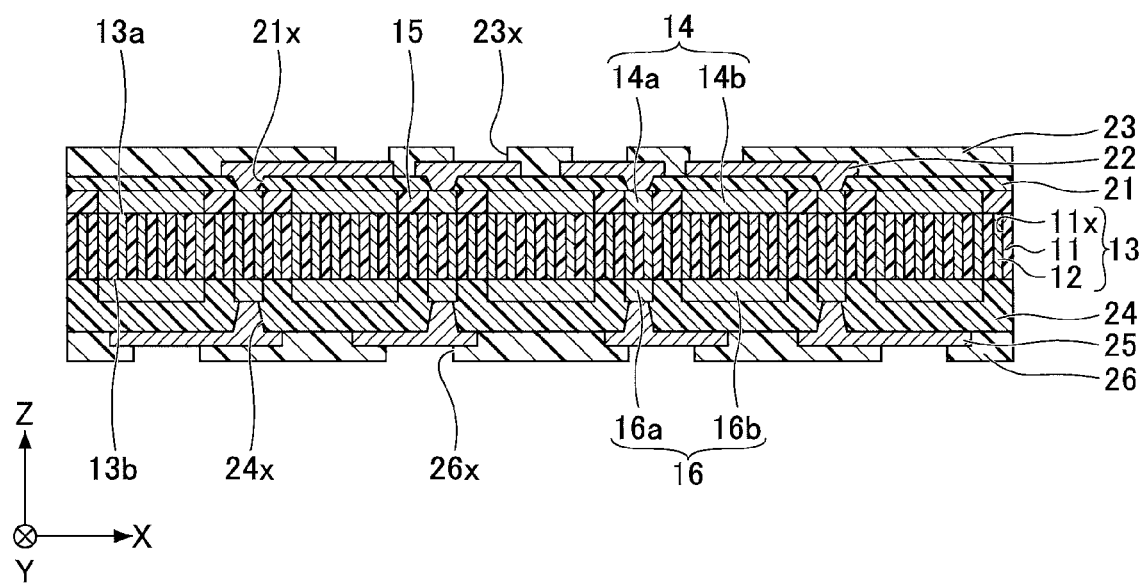
FIG. 6 is a cross-sectional view illustrating a wiring substrate according to a second embodiment of the present invention.

First, a structure of a wiring substrate 10 and a structure of a semiconductor package 30 according to the second embodiment of the present invention are described. FIG. 6 is a cross-sectional view illustrating an example of the wiring substrate 20 according to the second embodiment of the present invention. With reference to FIG. 6, the wiring substrate 20 of the second embodiment has a structure in which a second insulating layer 21, a third wiring layer 22, a solder resist layer 23, a third insulating layer 24, a fourth wiring layer 25, and a solder resist layer 26 are added to the wiring substrate 10 of the first embodiment.

The second insulating layer 21 is formed to cover the upper surface of the first wiring layer 14 and the upper surface of the first insulating layer 15. For example, a silicon oxide film ($SiO_2$), benzocyclobutene (BCB), polybenzooxazole (PBO), or polyimide (PI) may be used as the material of the second insulating layer 21. The thickness of the second insulating layer 21 may be, for example, 1 g m to 10 μm. However, the second insulating layer 21 is preferred to be thinly formed to a thickness not greater than the thickness of the first wiring layer 14. This is because the second insulating layer 21 can have a low dielectric constant and the high frequency property of the wiring substrate 20 can be improved. For example, in a case where the thickness of the first wiring layer 14 is 8 μm, the thickness of the second insulating layer 21 is preferred to be 1 μm to 8 μm.

The third wiring layer 22 is layered on the second insulating layer 21. The second insulating layer 21 includes a via hole(s) 21x penetrating the second insulating layer 21 and exposing the upper surface of the first wiring layer 14. The third wiring layer 22 includes a via wiring that fills the via hole 21x and a wiring pattern that is formed on the upper surface of the second insulating layer 21. The via hole 21x is open toward the solder resist layer 23 (opening part) and has a bottom surface formed by the upper surface of the first wiring layer 14 (bottom part). The via hole 21x includes a recess part having a circular truncated cone shape in which the opening part of the via hole 21x has an area larger than the area of the bottom surface of the via hole 21x. For example, copper (Cu) may be used as the material of the third wiring layer 22. The thickness of the third wiring layer 22 may be, for example, approximately 3 μm to 8 μm.

The solder resist layer 23 is formed on the upper surface of the second insulating layer 21 to cover the third wiring layer 22. The solder resist layer 23 may be formed of, for example a photosensitive resin. The thickness of the solder resist layer 23 may be, for example, approximately 10 μm to 30 μm.

The solder resist layer 23 includes an opening part 23x. A portion of the third wiring layer 22 is exposed in the opening part 23x. The third wiring layer 22, which has a portion exposed in the opening part 23x, functions as an electrode pad that is to be electrically connected to a semiconductor chip (not illustrated). Thus, the third wiring layer 22 may also be referred to as a first pad 22. The plan-view shape of the first pad 22 may be, for example, a circular shape. The diameter of the first pad 22 and the pitch between the first pads 22 may be arbitrarily set to match the specifications of the semiconductor chip (not illustrated) to be mounted thereon.

According to necessity, a metal layer may be formed on the upper surface of the first pad (third wiring layer) 22. Alternatively, an anti-oxidation process such as an OSP (Organic Solderability Preservative) process may be performed on the upper surface of the first pad (third wiring layer 22). The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

The third insulating layer 24 is formed on the other surface 13b of the core layer 13 to cover the second wiring layer 16. For example, an insulating resin such as an epoxy type resin may be used as the material of the third insulating layer 24. The thickness of the third insulating layer 24 may be, for example, approximately 10 μm to 30 μm. The third insulating layer 24 may include a filler such as silica ($SiO_2$).

The fourth wiring layer 25 is layered on the third insulating layer 24. The third insulating layer 24 includes a via hole(s) 24x penetrating the third insulating layer 24 and exposing the lower surface of the second wiring layer 16. The fourth wiring layer 25 includes a via wiring that fills the via hole 24x and a wiring pattern that is formed on the lower surface of the third insulating layer 24. The via hole 24x is open toward the solder resist layer 26 (opening part) and has a bottom surface formed by the lower surface of the second wiring layer 16 (bottom part). The via hole 24x includes a recess part having a circular truncated cone shape in which the opening part of the via hole 24x has an area larger than the area of the bottom surface of the via hole 24x. For example, copper (Cu) may be used as the material of the fourth wiring layer 25. The thickness of the fourth wiring layer 25 may be, for example, approximately 10 μm to 20 μm.

The solder resist layer 26 is formed on the lower surface of the third insulating layer 24 to cover the fourth wiring layer 25. The solder resist layer 26 may be formed of, for example a photosensitive resin. The thickness of the solder resist layer 26 may be, for example, approximately 20 μm to 30 μm.

The solder resist layer 26 includes an opening part 26x. A portion of the fourth wiring layer 25 is exposed in the opening part 26x. The fourth wiring layer 25, which has a portion exposed in the opening part 26x, functions as an electrode pad that is to be electrically connected to a mounting substrate (not illustrated) such as a motherboard. Thus, the fourth wiring layer 25 may also be referred to as a second pad 25. The plan-view shape of the second pad 25 may be, for example, a circular shape. The diameter of the second pad 25 and the pitch between the second pads 25 may be arbitrarily set to match the specifications of the mounting substrate (e.g., motherboard, not illustrated) to be mounted thereon.

However, similar to the semiconductor chip mounted on the solder resist layer 23, a semiconductor chip may also be mounted on the solder resist layer 26. In this case, the diameter of the second pad 25 and the pitch between the second pads 25 may be arbitrarily set to match the specifications of the semiconductor chip to be mounted thereon.

According to necessity, a metal layer may be formed on the lower surface of the fourth wiring layer (second pad) 25. Alternatively, an anti-oxidation process such as an OSP (Organic Solderability Preservative) process may be performed on the lower surface of the fourth wiring layer (second pad) 25. The example of the metal layer may be substantially the same as the metal layer formed on the upper surface of the first pad (third wiring layer) 22.

Figure 7:
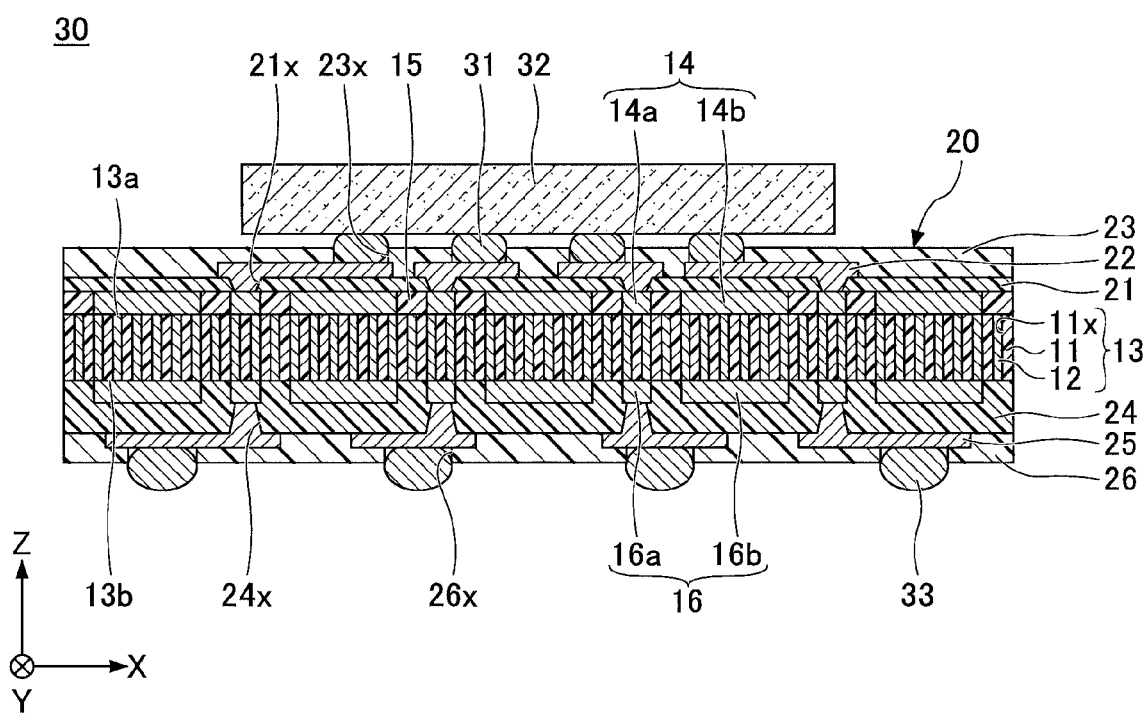
FIG. 7 is a cross-sectional view illustrating a semiconductor package according to the second embodiment of the present invention.

FIG. 7 is a cross-sectional view illustrating an example of the semiconductor package 30 according to the second embodiment of the present invention. As illustrated in FIG. 7, the semiconductor package 30 includes the wiring substrate 20, bumps 31, a semiconductor chip 32, and external connection terminals 33.

The bumps 31 are arranged on the upper surface of the first pads 22 of the wiring substrate 20. For example, solder balls may be used as the bumps 31. The material of the solder balls may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu).

The semiconductor chip 32 is mounted on the one surface 13a side of the core layer 13 of the wiring substrate 20. The electrode pads (not illustrated) of the semiconductor chip 32 are electrically connected to the first pads 22 by way of the bumps 31. In other words, the semiconductor chip 32 is electrically connected to the wiring substrate 20 by way of the bumps 31.

The external connection terminals 33 are arranged on the lower surface of the second pads 25 of the wiring substrate 20. For example, solder balls may be used as the external connection terminals 33. The material of the solder balls may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu).

Method for Manufacturing Wiring Substrate and Semiconductor Package of Second Embodiment Next, a method for manufacturing a wiring substrate and a semiconductor package according to the second embodiment of the present invention is described. FIGS. 8A-9C are schematic diagrams illustrating processes of the method for manufacturing the wiring substrate and the semiconductor package according to the second embodiment of the present invention.

Figure 8A:
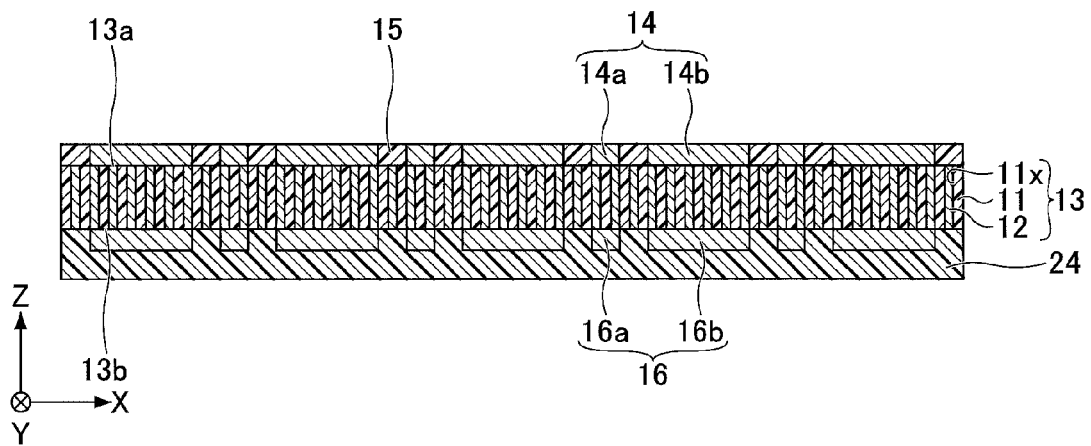
FIGS. 8A-8C are schematic diagrams illustrating processes for manufacturing the wiring substrate and the semiconductor package according to the second embodiment of the present invention (part 1)

First, after the processes illustrated in FIGS. 2A-3C have been performed, the process illustrated in FIG. 8A is performed. In the process illustrated in FIG. 8A, the third insulating layer 24 is formed on the other surface 13b of the core layer 13 to cover the second wiring layer 16. The third insulating layer 24 is formed on the other surface 13b of the core layer 13 by laminating and curing an insulating resin film (e.g., epoxy type resin) that covers the second wiring layer 16. Alternatively, instead of laminating an insulating resin film, the third insulating layer 24 may be formed by applying a liquid or paste-like resin and curing the liquid or paste-like resin. The thickness of the third insulating layer 24 may be, for example, approximately 10 μm to 30 μm. The third insulating layer 24 may include a filler such as silica ($SiO_2$).

Figure 8B:
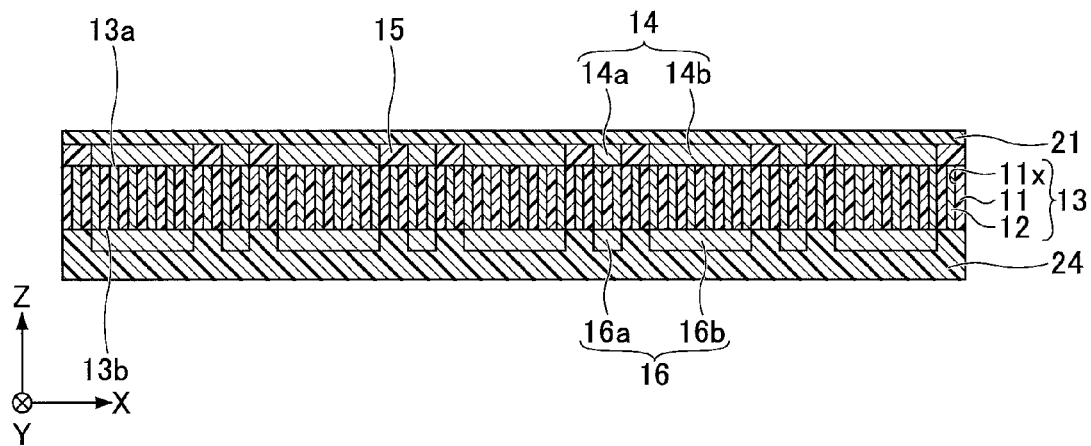

Then, in the process illustrated in FIG. 8B, the second insulating layer 21 is formed to cover the upper surface of the first wiring layer 14 and the upper surface of the first insulating layer 15. For example, the second insulating layer 21 that includes a silicon oxide film ($SiO_2$) can be formed by a CVD method. Alternatively, the second insulating layer 21 that mainly includes, for example, benzocyclobutene (BCB), polybenzooxazole (PBO), or polyimide (PI) may be formed by a spin-coating method. As described above, although the thickness of the second insulating layer 21 may be, for example, 1 μm to 10 μm, the second insulating layer 21 is preferred to be thinly formed to a thickness not greater than the thickness of the first wiring layer 14.

Figure 8C:
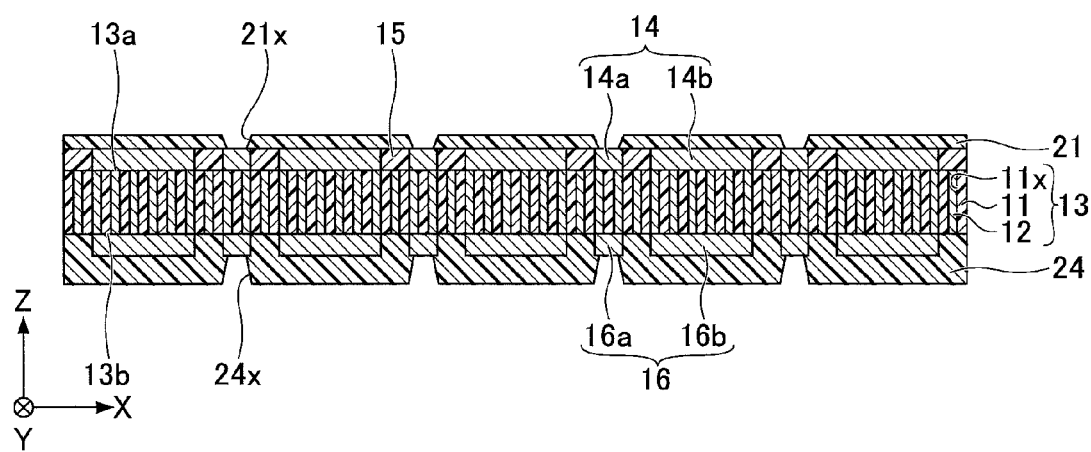

In the process illustrated in FIG. 8C, the via hole 21x, which penetrates the second insulating layer 21 and exposes the upper surface of the first wiring layer 14, is formed in the second insulating layer 21. Further, the via hole 24x, which penetrates the third insulating layer 24 and exposes the lower surface of the second wiring layer 16, is formed in the third insulating layer 24. The via holes 21x, 24x may be formed by using, for example, a laser process method (e.g., $CO_2$ laser). After forming the via holes 21x, 24x, it is preferable to perform a desmearing process for removing residual resin adhered to the surfaces of the first and second wiring layers 14, 16 exposed at the bottom parts of the via holes 21x, 24x.

Figure 9A:
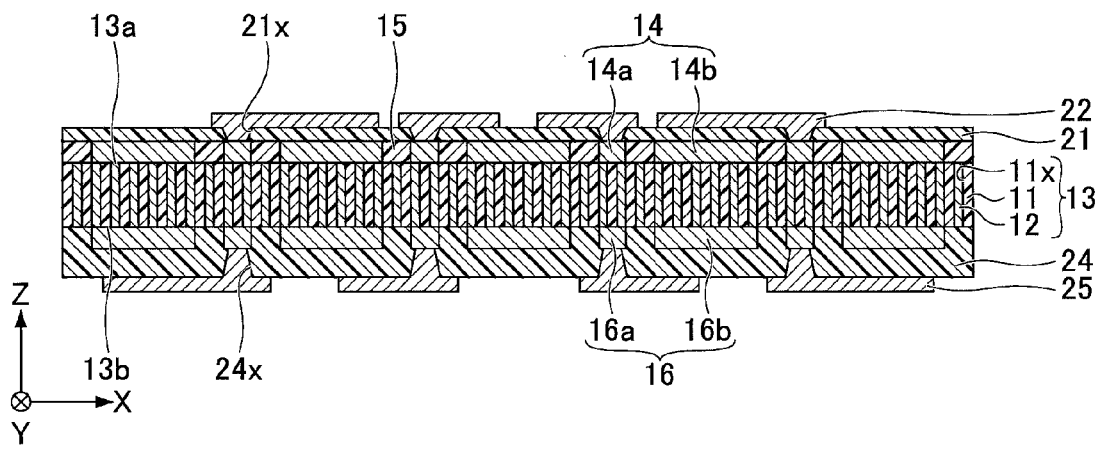
FIGS. 9A-9C are schematic diagrams illustrating processes for manufacturing the wiring substrate and the semiconductor package according to the second embodiment of the present invention (part 2)

Then, in the process illustrated in FIG. 9A, the third wiring layer 22 is layered on the second insulating layer 21. The third wiring layer 22 is constituted by a via wiring filling the inside of the via hole 21x and a wiring pattern formed on the upper surface of the second insulating layer 21. The third wiring layer 22 is electrically connected to the first wiring layer 14 exposed at the bottom part of the via hole 21x.

Likewise, the fourth wiring layer 25 is layered on the third insulating layer 24. The fourth wiring layer 25 is constituted by a via wiring filling the inside of the via hole 24x and a wiring pattern formed on the lower surface of the third insulating layer 24. The fourth wiring layer 25 is electrically connected to the second wiring layer 16 exposed at the bottom part of the via hole 24x.

For example, copper (Cu) may be used as the material of each of the third and fourth wiring layers 22, 25. The thickness of each of the third and fourth wiring layers 22, 25 may be, for example, approximately 10 μm to 30 μm. Each of the third and fourth wiring layers 22, 25 may be formed by using various wiring forming methods such as a semi-additive method or a subtractive method.

Figure 9B:
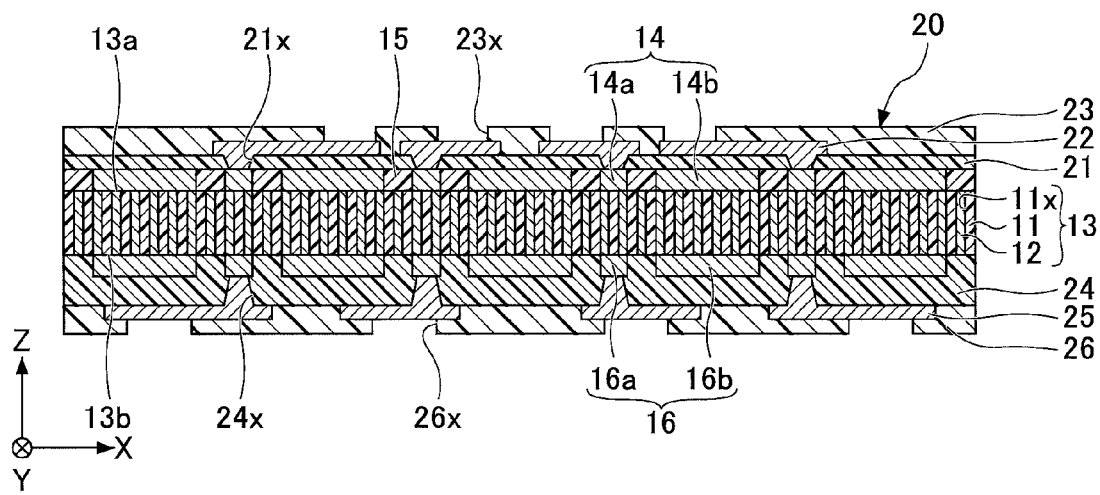

Then, in the process illustrated in FIG. 9B, the solder resist layer 23 is formed on the upper surface of the second insulating layer 21 to cover the third wiring layer 22. The solder resist layer 23 may be formed on the second insulating layer 21 to cover the third wiring layer 22 by applying a liquid or paste-like photosensitive epoxy type insulating resin on the upper surface of the second insulating layer 21. The liquid or paste-like photosensitive epoxy type insulating resin may be applied by using, for example, a screen printing method, a roll coating method, or a spin coating method.

Alternatively, the solder resist layer 23 may be formed on the second insulating layer 21 and cover the wiring layer 18 by laminating a film-like photosensitive epoxy type insulating resin on the upper surface of the second insulating layer 21. Likewise, the solder resist layer 26 is formed on the lower surface of the third insulating layer 24 to covers the fourth wiring layer 25. The thickness of each of the solder resist layers 23, 26 may be, for example, approximately 10 μm to 30 μm.

Then, the opening part 23x is formed on the solder resist layer 23 by exposing and developing the applied or laminated insulating resin (photolithographic method). The portion of the third wiring layer (first pad) 22 is exposed in the opening part 23x. Further, the opening part 26x is formed on the solder resist layer 26 by exposing and developing the applied or laminated insulating resin (photolithographic method). The portion of the fourth wiring layer (second pad) 25 is exposed in the opening part 26x.

Alternatively, the opening parts 23x, 26x may be formed by using, for example, a laser processing method or a blasting method. The plan-view shape of each of the opening parts 23x, 26x may be, for example, a circular shape. The diameter of each of the opening parts 23x, 26x may be arbitrarily set to match with, for example, a semiconductor chip (not illustrated) or the pitch of the terminals of a motherboard (not illustrated).

According to necessity, a metal layer may be formed on the upper surface of the first pad 22 or the lower surface of the second pad 25 by using, for example, an electroless plating method. Alternatively, instead of forming the metal layer, an anti-oxidation process (e.g., OSP (Organic Solderability Preservative)) may be performed on the upper surface of the first pad 22 or the lower surface of the second pad 25. Examples of the metal layer are the same as those described above.

Although the manufacturing of the wiring substrate 20 illustrated in FIG. 6 is completed by performing the processes illustrated in FIGS. 8A-9B, the following processes may be additionally performed for manufacturing the semiconductor package illustrated in FIG. 7. That is, in the process illustrated in FIG. 9C, the bumps 31 are formed on the upper surfaces of the first pads 22. Likewise, the external connection terminals 33 are formed on the lower surfaces of the second pads 25.

Solder balls may be used as the bumps 31 and the external connection terminals 33. The material of the solder balls may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu).

In forming the bumps 31 and the external connection terminals 33, flux may be applied on, for example, the upper surfaces of the first pads 22 and the lower surfaces of the second pads 25 as a surface treatment agent. Then, solder balls are mounted on the upper surfaces of the first pads 22 and the lower surfaces of the second pads 25 and subjected to a reflow process in a temperature of approximately 240° C. to 260° C. Then, the flux is removed by cleaning the surface of the wiring substrate 20.

Figure 9C:
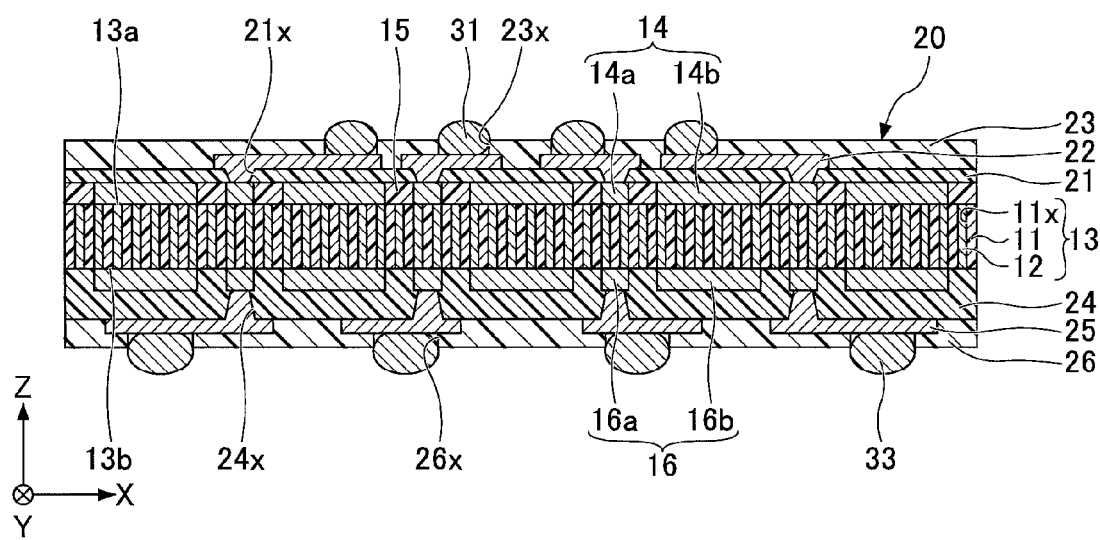

Then, although not illustrated, the semiconductor chip 32 is prepared after performing the process illustrated in FIG. 9C. The semiconductor chip 32 is placed on the one surface 13a side of the core layer 13 of the wiring substrate 20, so that the bumps 31 of the wiring substrate 20 match the positions of corresponding electrode pads (not illustrated) of the semiconductor chip 32. Then, the wiring substrate 20 having the semiconductor chip 32 placed thereon is heated to a temperature of, for example, approximately 230° C., so that the solder constituting the bumps (solder balls) 31 is melted. Thereby, the first pads 22 of the wiring substrate 20 can be electrically and mechanically connected to the electrode pads (not illustrated) of the semiconductor chip 32.

In a case where solder is formed on the electrode pads (not illustrated) of the semiconductor chip 32, the solder on the electrode pad (not illustrated) of the semiconductor chip 32 and the solder constituting the bumps (solder balls) 31 are melted and become an alloy. Thereby, the solder on the electrode pads (not illustrated) of the semiconductor chip 32 and the solder constituting the bumps (solder balls) 31 become a single bump, respectively. According to necessity, an underfill resin may be filled in-between the wiring substrate 20 and the semiconductor chip 32. Thereby, manufacturing of the semiconductor package 30 having the semiconductor chip 32 mounted on the one surface side 13a of the core layer 13 of the wiring substrate 20 is completed (see FIG. 7).

Figure 10:
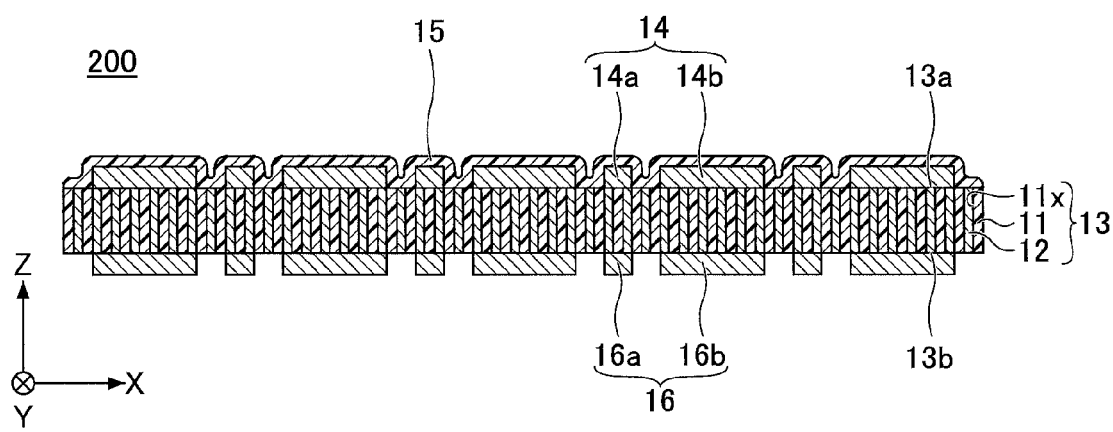
FIG. 10 is a cross-sectional view illustrating a wiring substrate according to a comparative example.

Accordingly, there can be obtained the wiring substrate 20 having multiple insulating layers and wiring layers formed on both surfaces of the wiring substrate 10 of the first embodiment. However, in a case of attempting to form an extremely thin insulating layer having high frequency property on an upper surface of an insulating layer 15 of a wiring substrate 200 according to a comparative example as illustrated in FIG. 10, an upper surface of the thin insulating film also becomes uneven (rugged) if the upper surface of the insulating layer 15 is not flat but uneven (rugged). Furthermore, in a case of attempting to form a wiring layer on an extremely thin insulating layer having an uneven upper surface, it is difficult to form the wiring layer with a fine pattern due to problems such as out-of-focus during exposure.

On the other hand, with the wiring substrate 10 of the first embodiment, the thickness of the first insulating layer 15 is substantially the same as the thickness of the first wiring substrate 14. In other words, the upper surface of the first insulating layer 15 is substantially flush with the upper surface of the first wiring layer 14 (the upper surface of the signal wiring 14a and the upper surface of the solid wiring 14b). Thus, the upper surface of the first insulating layer 15 and the upper surface of the first wiring layer 14, as a whole, form a flat surface.

Accordingly, the second insulating layer 21, which has a thickness not greater than the thickness of the first wiring layer 14 and exhibits a satisfactory high frequency property, can be easily formed on the flat surface constituted by the upper surface of the first insulating layer 15 and the upper surface of the first wiring layer 14. Further, a fine-patterned third wiring layer 22 can be formed on the flat second insulating layer 21. As a result, the semiconductor chip 32 having narrow-pitched pads and terminals can be easily mounted on the wiring substrate 20 toward the flat surface constituted by the upper surface of the first insulating layer 15 and the upper surface of the first wiring layer 14.

The wiring substrate 10 may be shipped as a product in a form illustrated in FIG. 1. The wiring substrate 20 may be shipped as a product in a form illustrated in FIG. 6. However, the form of the product is not limited to those illustrated in the drawings and may be arbitrarily changed. For example, the structure illustrated in FIG. 8A, 8B; or 9C may be the form in which the wiring substrates 10, 20 are shipped as a product.

Third Embodiment

The following third embodiment of the present invention illustrates an example of a semiconductor package having semiconductor chips mounted on both surfaces of a wiring substrate. In the third embodiment, like components are denoted with like reference numerals as those of the first-second embodiments and are not further explained.

Structure of Wiring Substrate and Semiconductor Package

Figure 11:
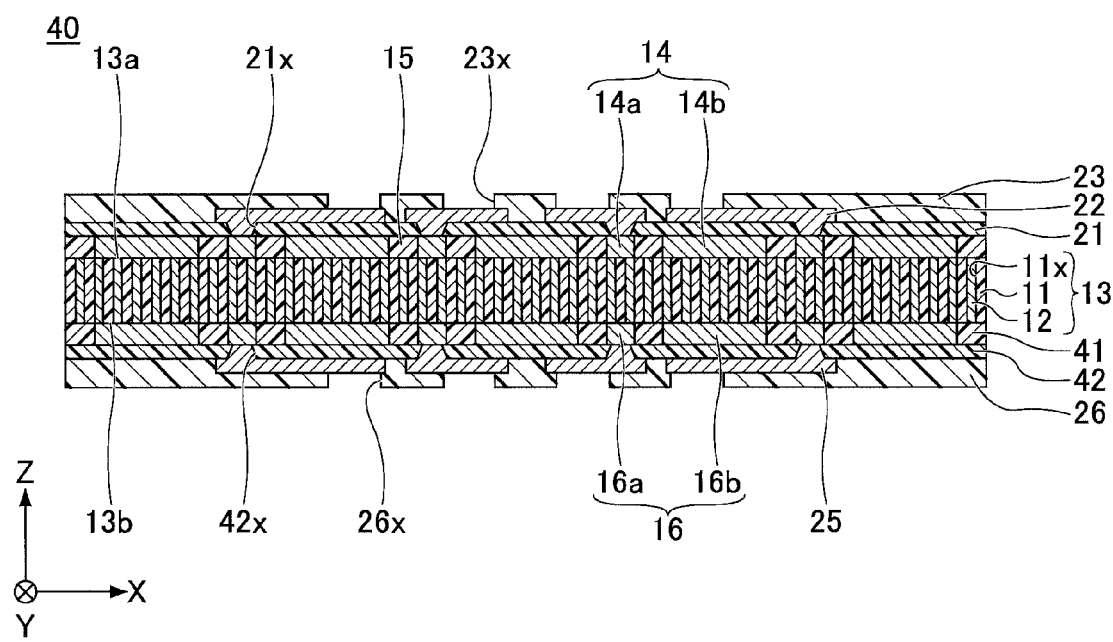
FIG. 11 is a cross-sectional view illustrating a wiring substrate according to a third embodiment of the present invention.

First, a structure of a wiring substrate 40 and a structure of a semiconductor package 50 according to the third embodiment of the present invention are described. FIG. 11 is a cross-sectional view illustrating an example of the wiring substrate 40 of the third embodiment. As illustrated in FIG. 11, the wiring substrate 40 of the third embodiment is different from the wiring substrate 20 of the second embodiment (see FIG. 6) in that the third insulating layer 24 is replaced with a third insulating layer 41 and a fourth insulating layer 42.

The third insulating layer 41 is formed in an area(s) of the other surface 13b of the core layer 13 where the second wiring layer 16 is not formed. For example, an epoxy type resin or an insulating resin having BCB (benzocyclobutene) as its main component may be used as the material of the third insulating layer 41. The thickness of the third insulating layer 41 is the same as the thickness of the second wiring layer 16. In other words, a lower surface of the third insulating layer 41 is substantially flush with a lower surface of the second wiring layer 16 (lower surfaces of the signal wirings 16a and the sold wirings 16b). Thus, the lower surface of the third insulating layer 41 and the lower surface of the second wiring layer 16, as a whole, form a flat surface.

The fourth insulating layer 42 is formed to cover the lower surface of the second wiring layer 16 and the lower surface of the third insulating layer 41. For example, a silicon oxide film ($SiO_2$), benzocyclobutene (BCB), polybenzooxazole (PBO), or polyimide (PI) may be used as the material of the fourth insulating layer 42. The thickness of the fourth insulating layer 42 may be, for example, 1 μm to 10 μm. However, the fourth insulating layer 42 is preferred to be thinly formed to a thickness not greater than the thickness of the second wiring layer 16. This is because the fourth insulating layer 42 can have a low dielectric constant and the high frequency property of the wiring substrate 40 can be improved. For example, in a case where the thickness of the second wiring layer 16 is 8 μm, the thickness of the fourth insulating layer 42 is preferred to be 1 μm to 8 μm.

The fourth wiring layer 25 is layered on the fourth insulating layer 42. The fourth insulating layer 42 includes a via hole(s) 42x penetrating the fourth insulating layer 42 and exposing the lower surface of the second wiring layer 16. The fourth wiring layer 25 includes a via wiring that fills the via hole 42x and a wiring pattern that is formed on the lower surface of the fourth insulating layer 42. The via hole 42x is open toward the solder resist layer 26 (opening part) and has a bottom surface formed by the lower surface of the second wiring layer 16 (bottom part). The via hole 42x includes a recess part having a circular truncated cone shape in which the opening part of the via hole 42x has an area larger than the area of the bottom surface of the via hole 42x. For example, copper (Cu) may be used as the material of the fourth wiring layer 25. The thickness of the fourth wiring layer 25 may be, for example, approximately 3 μm to 8 μm.

The solder resist layer 26 is formed on the lower surface of the fourth insulating layer 42 to cover the fourth wiring layer 25. The solder resist layer 26 includes an opening part 26x. A portion of the fourth wiring layer 25 is exposed in the opening part 26x. The fourth wiring layer 25, which has a portion exposed in the opening part 26x, functions as an electrode pad that is to be electrically connected to a semiconductor chip (not illustrated). Thus, the fourth wiring layer 25 may also be referred to as a second pad 25. The diameter of the second pad 25 and the pitch between the second pads 25 may be arbitrarily set to match the specifications of the semiconductor chip (not illustrated) to be mounted thereon.

According to necessity, a metal layer may be formed on the lower surface of the second pad 25. Alternatively, an anti-oxidation process such as an OSP (Organic Solderability Preservative) process may be performed on the lower surface of the second pad 25. Examples of the metal layer are the same as those described above.

Figure 12:
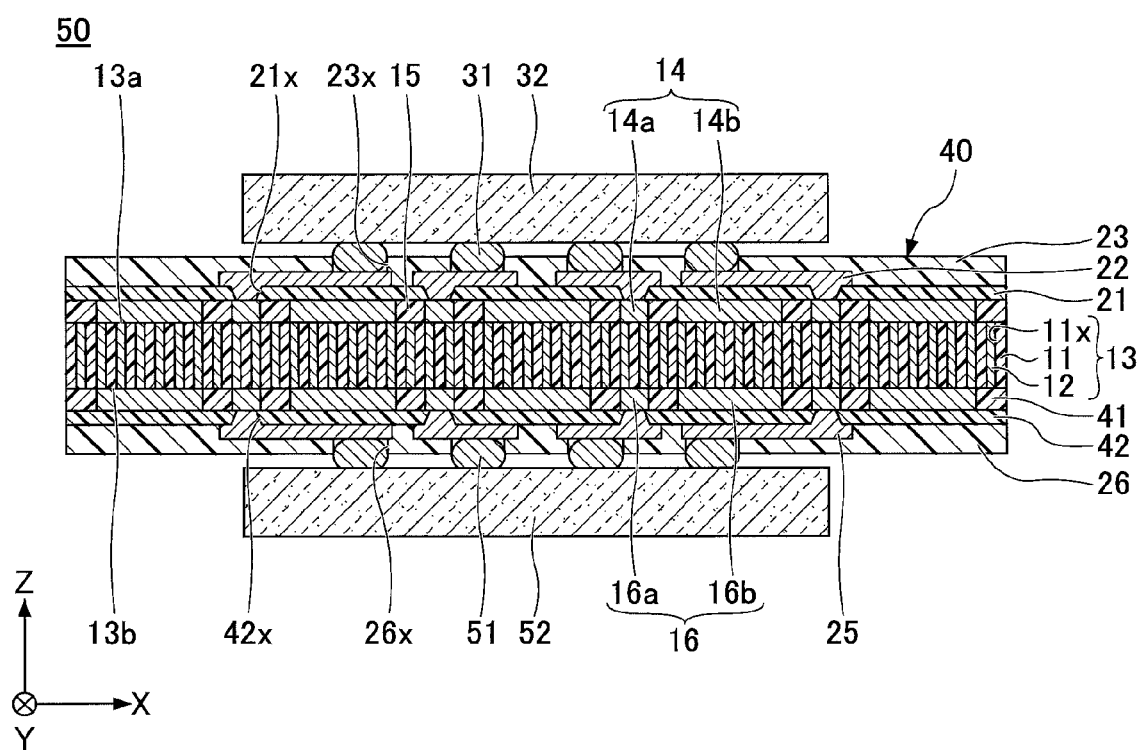
FIG. 12 is a cross-sectional view illustrating a semiconductor package according to the third embodiment of the present invention.

FIG. 12 is a cross-sectional view illustrating an example of the semiconductor package 50 of the third embodiment. As illustrated in FIG. 12, the semiconductor package 50 of the third embodiment is different from the semiconductor package 30 of the second embodiment (see FIG. 7) in that semiconductor chips are mounted on both surfaces of the wiring substrate 40.

In the semiconductor package 50, bumps 51 are arranged on the lower surface of the second pads 25 of the wiring substrate 40. For example, solder balls may be used as the bumps 51. The material of the solder balls may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu).

The semiconductor chip 52 is mounted on the other surface 13b side of the core layer 13 of the wiring substrate 40. The electrode pads (not illustrated) of the semiconductor chip 52 are electrically connected to the second pads 25 by way of the bumps 51. In other words, the semiconductor chip 52 is electrically connected to the wiring substrate 40 by way of the bumps 51.

Figure 13A:
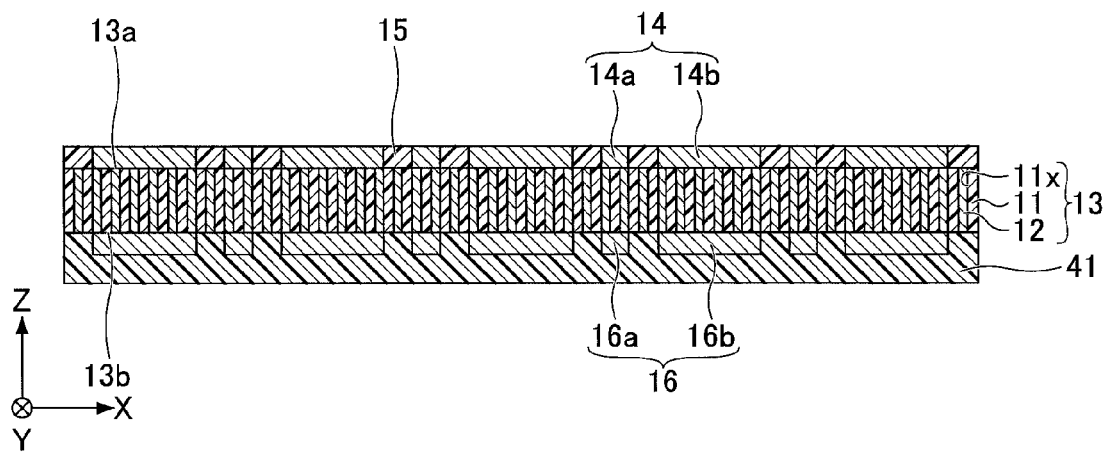
FIGS. 13A-13C are schematic diagrams illustrating processes for manufacturing a wiring substrate according to the third embodiment of the present invention.
Figure 13B:
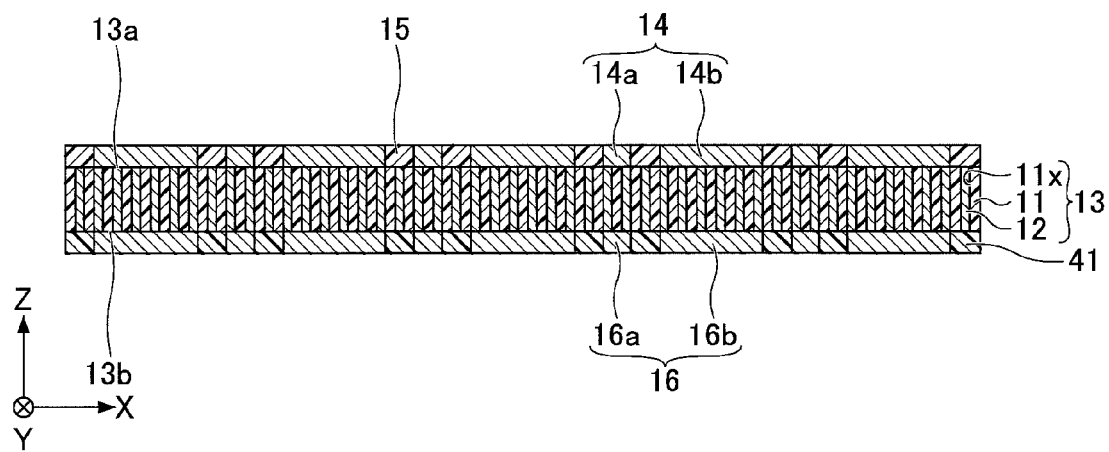
Figure 13C:
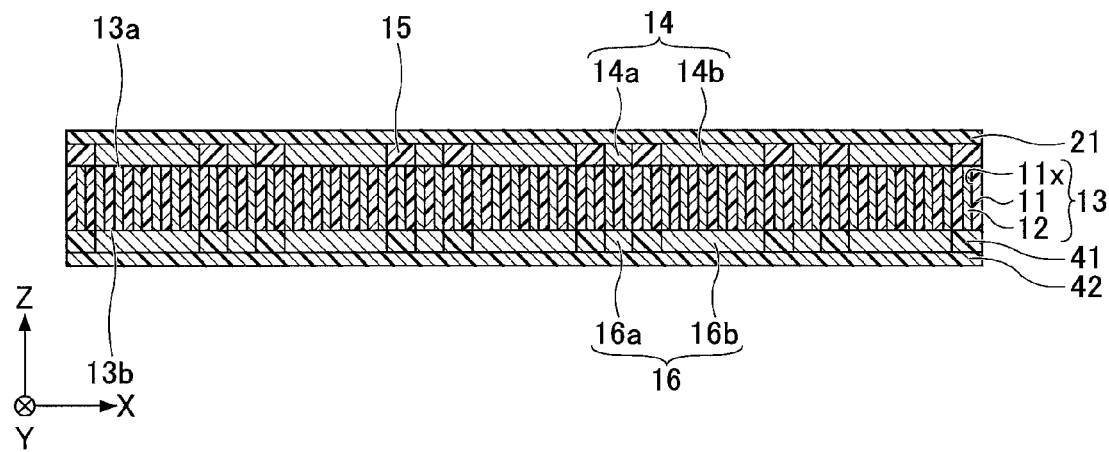

Method for Manufacturing Wiring Substrate and Semiconductor Package of Third Embodiment Next, a method for manufacturing a wiring substrate and a semiconductor package according to the third embodiment of the present invention is described. FIGS. 13A-13C are schematic diagrams illustrating processes of the method for manufacturing the wiring substrate and the semiconductor package according to the third embodiment of the present invention.

First, after the processes illustrated in FIGS. 2A-3C of the first embodiment have been performed, the process illustrated in FIG. 13A is performed. In the process illustrated in FIG. 13A, the third insulating layer 41 is formed on the other surface 13b of the core layer 13 to cover the second wiring layer 16. The third insulating layer 41 is formed on the other surface 13b of the core layer 13 by laminating and curing an insulating resin film (e.g., epoxy type resin) that covers the second wiring layer 16. Alternatively, instead of laminating an insulating resin film, the third insulating layer 41 may be formed by applying a liquid or paste-like resin and curing the liquid or paste-like resin. The thickness of the third insulating layer 41 may be, for example, approximately 10 μm to 30 μm. The third insulating layer 41 may include a filler such as silica ($SiO_2$).

Then, in the process illustrated in FIG. 13B, the thickness of the third insulating layer 41 is reduced by polishing (e.g., chemical mechanical polishing (CMP)) the lower surface of the third insulating layer 41 until the lower surface of the second wiring layer 16 becomes exposed. During this process, a portion of the lower surface of the second wiring layer 16 may also be polished. As a result, the third insulating layer 41 having substantially the same thickness as the second wiring layer 16 is formed on areas of the other surface 13b of the core layer 13 where the second wiring layer 16 is not formed. In other words, the lower surface of the third insulating layer 41 is substantially flush with the lower surface of the second wiring layer 16 (lower surface of the signal wiring 16a and lower surface of the solid wiring 16b). Thus, the lower surface of the third insulating layer 41 and the lower surface of the second wiring layer 16, as a whole, form a flat surface.

Then, in the process illustrated in FIG. 13C, the second insulating layer 21 is formed to cover the upper surface of the first wiring layer 14 and the upper surface of the first insulating layer 15. Further, the fourth insulating layer 42 is formed to cover the lower surface of the second wiring layer 16 and the lower surface of the third insulating layer 41. The second insulating layer 21 and the fourth insulating layer 42 can be formed by performing the above-described process illustrated in FIG. 8B. As described above, the thickness of the second insulating layer 21 is preferred to be thinly formed to a thickness not greater than the thickness of the first wiring layer 14. Further, the thickness of the fourth insulating layer 42 is preferred to be thinly formed to a thickness not greater than the thickness of the second wiring layer 16.

Then, the manufacturing of the wiring substrate 40 illustrated in FIG. 11 is completed by performing the processes illustrated in FIGS. 8C-9B. Further, by performing the process illustrated in FIG. 9C of the second embodiment, the bumps 31 are formed on the upper surfaces of the first pads 22, and the bumps 51 are formed on the lower surfaces of the second pads 25. Then, the semiconductor chip 32 is mounted on the one side of the wiring substrate 40 by way of the bumps 31, and the semiconductor chip 52 is mounted on the other side of the wiring substrate 40 by way of the bumps 51. Thereby, the manufacturing of the semiconductor package 50 of FIG. 12 is completed.

Accordingly, with the wiring substrate 40 of the third embodiment, the third insulating layer 41 having substantially the same thickness as the second wiring layer 16 can be formed on areas of the other surface 13b of the core layer 13 where the second wiring layer 16 is not formed. Accordingly, an extremely thin fourth insulating layer 42 covering the lower surface of the second wiring layer 16 and the lower surface of the third insulating layer 41 can be formed. Thus, the high frequency property of the fourth insulating layer 42 can be improved. Because the lower surface of the extremely thin fourth insulating layer 42 can be formed as a flat surface, problems such as out-of-focus during exposure can be prevented. Accordingly, a fine-patterned fourth wiring layer 25 can be formed on the lower surface of the fourth insulating layer 42. As a result, the semiconductor chip 52 having narrow-pitched pads and terminals can be easily mounted on the wiring substrate 40 toward the flat surface constituted by the lower surface of the third insulating layer 41 and the lower surface of the second wiring layer 16.

It is to be noted that the semiconductor chip 32 and the semiconductor chip 52 do not need to have the same shape or the same function. Further, multiple semiconductor chips may be mounted on the one side, the other side, or both sides of the wiring substrate 40.

Modified Examples of First Embodiment

The following modified examples of the first embodiment illustrate variations of a wiring substrate of the first embodiment. In the modified examples of the first embodiment, like components are denoted with like reference numerals as those of the first-third embodiments and are not further explained.

Figure 14A:
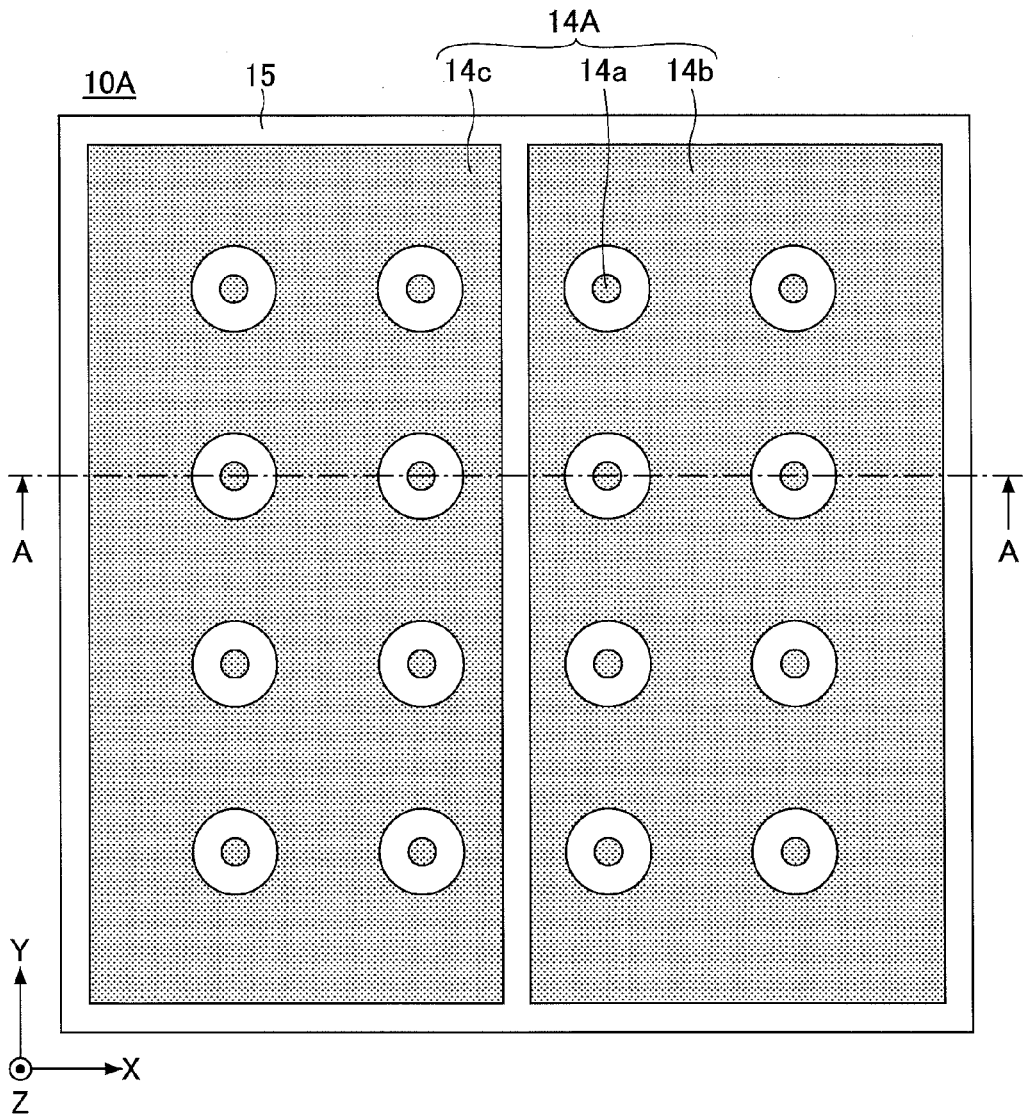
FIGS. 14A-14B are schematic diagrams illustrating a wiring substrate according to a first modified example of the first embodiment.
Figure 14B:
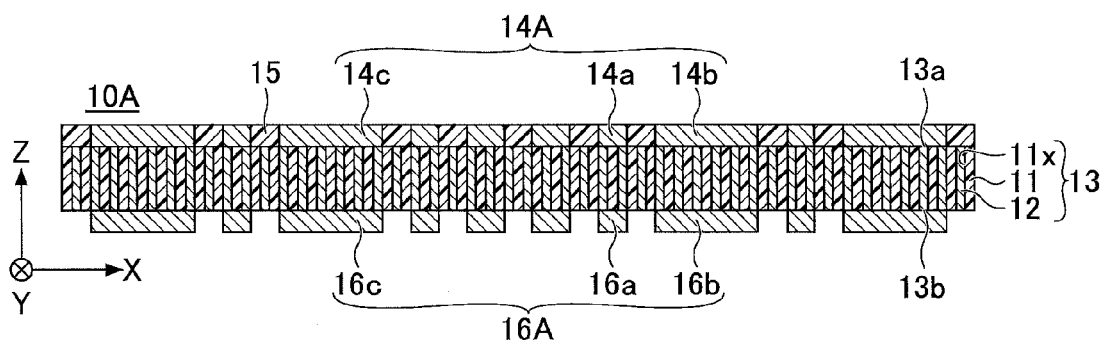

FIGS. 14A and 14B are diagrams illustrating a wiring substrate 10A of a first modified example of the first embodiment. FIG. 14A is a plan view of the wiring substrate 10A. FIG. 14B is a cross-sectional view of the wiring substrate 10A taken along line A-A of FIG. 14A. As illustrated in FIGS. 14A and 14B, the wiring substrate 10A of the first modified example of the first embodiment is different from the wiring substrate 10 of the first embodiment (see FIGS. 1A and 1B) in that the first wiring layer 14 is replaced with a first wiring layer 14A, and the second wiring layer 16 is replaced with a second wiring layer 16A. For the sake of convenience, the first wiring layer 14A is illustrated with a satin pattern in FIG. 14A.

Unlike the first wiring layer 14 of the wiring substrate 10, the first wiring layer 14A includes signal wirings 14a, solid wirings 14b, and solid wirings 14c. The solid wirings 14b are arranged in predetermined areas on the one surface 13a of the core layer 13. The solid wirings 14c are also arranged on the one surface 13a of the core layer 13 but on areas different from the areas on which the solid wirings 14b are arranged. The signal wirings 14a, which are arranged at predetermined intervals, are surrounded by the solid wirings 14b or the solid wirings 14c. The solid wirings 14b and the solid wirings 14c are insulated from each other.

Likewise, unlike the second wiring layer 16 of the wiring substrate 10, the second wiring layer 16A includes signal wirings 16a, solid wirings 16b, and solid wirings 16c. The solid wirings 16b are arranged in predetermined areas on the other surface 13b of the core layer 13. The solid wirings 16c are also arranged on the other surface 13b of the core layer 13 but on areas different from the areas on which the solid wirings 16b are arranged. The signal wirings 16a, which are arranged at predetermined intervals, are surrounded by the solid wirings 16b or the solid wirings 16c. The solid wirings 16b and the solid wirings 16c are insulated from each other.

The signal wirings 14a and the signal wirings 16a are positioned to superpose each other from a plan view. The signal wirings 14a and the signal wirings 16a are electrically connected to each other by way of the linear conductors 12. Further, the solid wirings 14b and the solid wirings 16b are positioned to superpose each other from a plan view. The solid wirings 14b and the solid wirings 16b are electrically connected to each other by way of the linear conductors 12. Further, the solid wirings 14c and the solid wirings 16c are positioned to superpose each other from a plan view. The solid wirings 14c and the solid wirings 16c are electrically connected to each other by way of the linear conductors 12.

The solid wirings 14b, 16b are connected to, for example, a first ground (GND) wiring. Further, the solid wirings 14c, 16c are connected to, for example, a second ground (GND) wiring. The first and second ground wirings may be used for different purposes. For example, the first ground wiring may be used for weak signals whereas the second ground wiring may be used for strong signals. Alternatively, one of the ground wirings may be used for analog signals whereas the other one of the ground wirings may be used for digital signals.

Accordingly, a solid wiring can be divided into two areas insulated from each other in which the solid wiring of each area is connected to a corresponding ground (GND) wiring. Thereby, the effect of shielding external noise can be improved. That is, the signal wirings 14a, 16a and the linear conductors 12 connecting the signal wirings 14a, 16a can be further shielded from external noise more effectively. In addition, the signal wirings 14a, 16a and the linear conductors 12 connecting the signal wirings 14a, 16a can be further prevented from becoming a noise source. It is to be noted that the solid wiring may be divided into three or more areas. Further, a portion of the solid wiring may be connected to a power source wiring instead of a ground wiring.

Further, the solid wirings 14b, 16b and the other portion of the linear conductors 12 connecting the solid wirings 14b, 16b are positioned between the adjacently arranged signal wirings 14a, 16a and the portion of the linear conductors 12 connecting the signal wirings 14a, 16a. Thereby, electrical coupling (capacity coupling) generated between the adjacently arranged signal wirings 14a, 16a and the other portion of the linear conductors 12 connecting the signal wirings 14a, 16a can be reduced. As a result, the signal wirings 14a, 16a and the portion of the linear conductors 12 connecting the signal wirings 14a, 16a can be prevented from becoming a noise source.

Figure 15A:
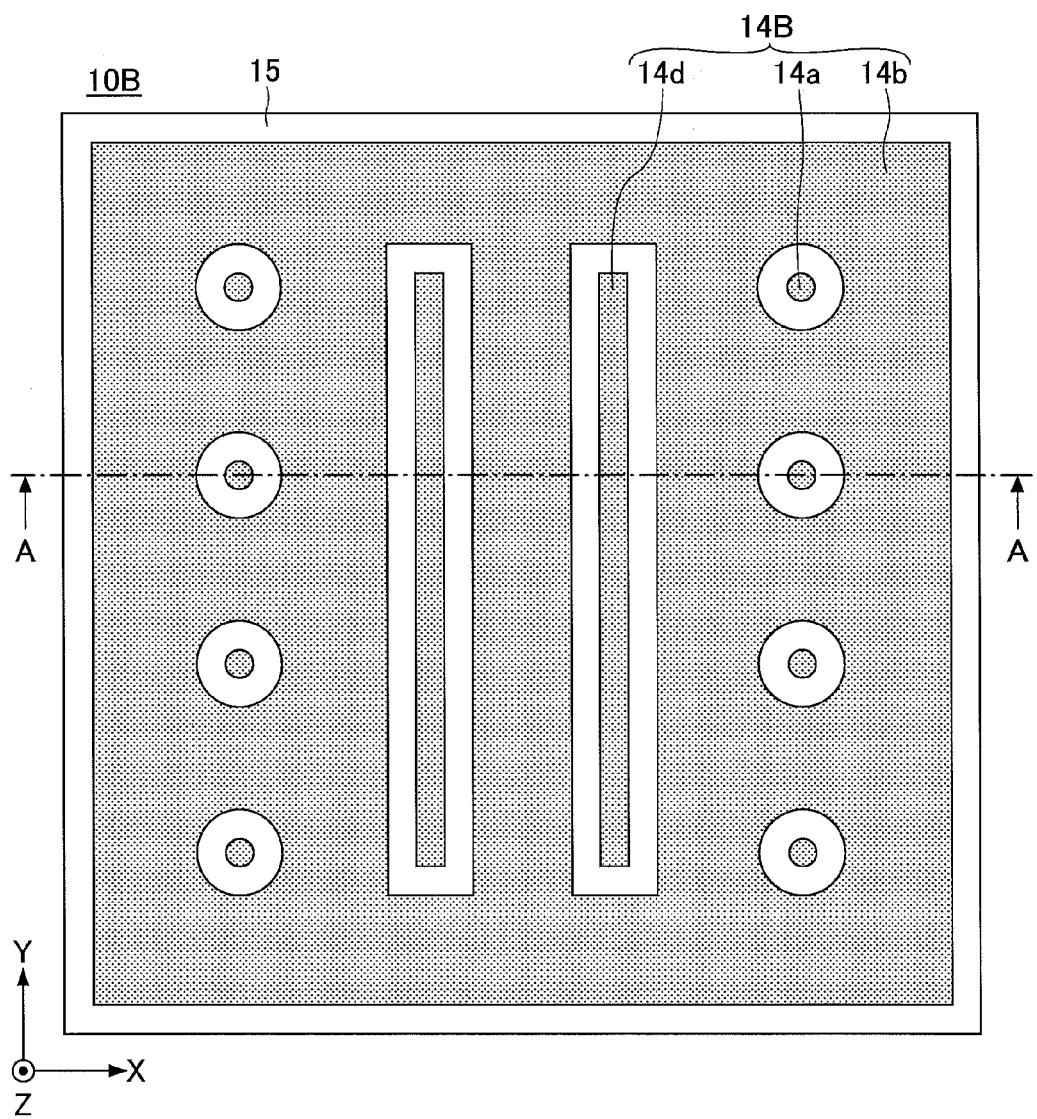
FIGS. 15A-15B are schematic diagrams illustrating a wiring substrate according to a second modified example of the first embodiment.
Figure 15B:
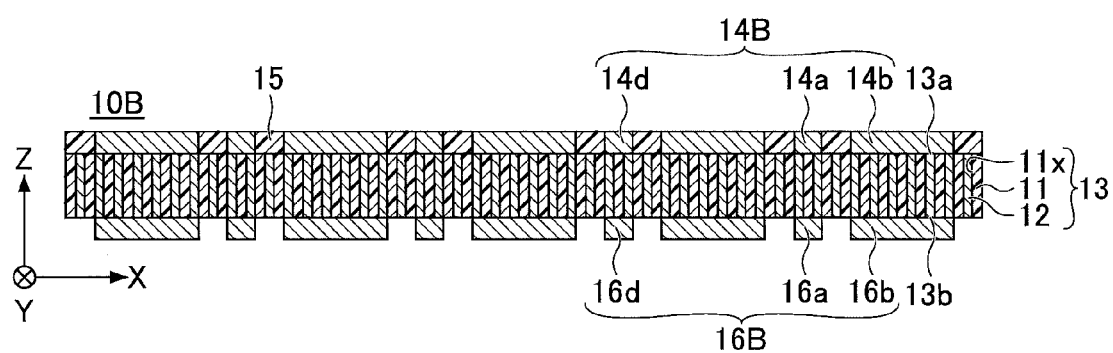

FIGS. 15A and 15B are diagrams illustrating a wiring substrate 10B of a second modified example of the first embodiment. FIG. 15A is a plan view of the wiring substrate 10B. FIG. 15B is a cross-sectional view of the wiring substrate 10B taken along line A-A of FIG. 15A. As illustrated in FIGS. 15A and 15B, the wiring substrate 10B of the second modified example of the first embodiment is different from the wiring substrate 10 of the first embodiment (see FIGS. 1A and 1B) in that the first wiring layer 14 is replaced with a first wiring layer 14B, and the second wiring layer 16 is replaced with a second wiring layer 16B. For the sake of convenience, the first wiring layer 14B is illustrated with a satin pattern in FIG. 15A.

Unlike the first wiring layer 14 of the wiring substrate 10, the first wiring layer 14B includes signal wirings 14a, signal wirings 14d, and solid wirings 14b. The signal wirings 14d are formed (patterned) into elongated shapes instead of circular shapes from a plan view. The plan-view shape of the signal wirings 14d may include a straight line portion and a curved line portion. That is, the plan-view shape of the signal wirings 14d may have a bent shape. The signal wirings 14d, which are arranged at predetermined intervals, are surrounded by solid wirings 14b.

Likewise, unlike the second wiring layer 16 of the wiring substrate 10, the second wiring layer 16B includes signal wirings 16a, signal wirings 16d, and solid wirings 16b. The signal wirings 16d are formed (patterned) into elongated shapes instead of circular shapes from a plan view. The plan-view shape of the signal wirings 16d may include a straight line portion and a curved line portion. That is, the plan-view shape of the signal wirings 16d may have a bent shape. The signal wirings 16d, which are arranged at predetermined intervals, are surrounded by solid wirings 16b.

The signal wirings 14a and the signal wirings 16a are positioned to superpose each other from a plan view. The signal wirings 14a and the signal wirings 16a are electrically connected to each other by way of the linear conductors 12. Further, the signal wirings 14d and the signal wirings 16d are positioned to superpose each other from a plan view. The solid wirings 14b and the solid wirings 16b are electrically connected to each other by way of the linear conductors 12.

Accordingly, patterned signal wirings 14d and 16d having predetermined plan-view shapes can be provided in superposing positions on the one and the other surfaces 13a, 13b of the core layer 13. Thus, the degree of freedom of designing the wiring substrate 10B can be improved.

Modified Example of Third Embodiment

The following modified example illustrates another example of a semiconductor package having semiconductor chips mounted on both surfaces of a wiring substrate. In the modified example of the third embodiment, like components are denoted with like reference numerals as those of the first-third embodiments and are not further explained.

Figure 16:
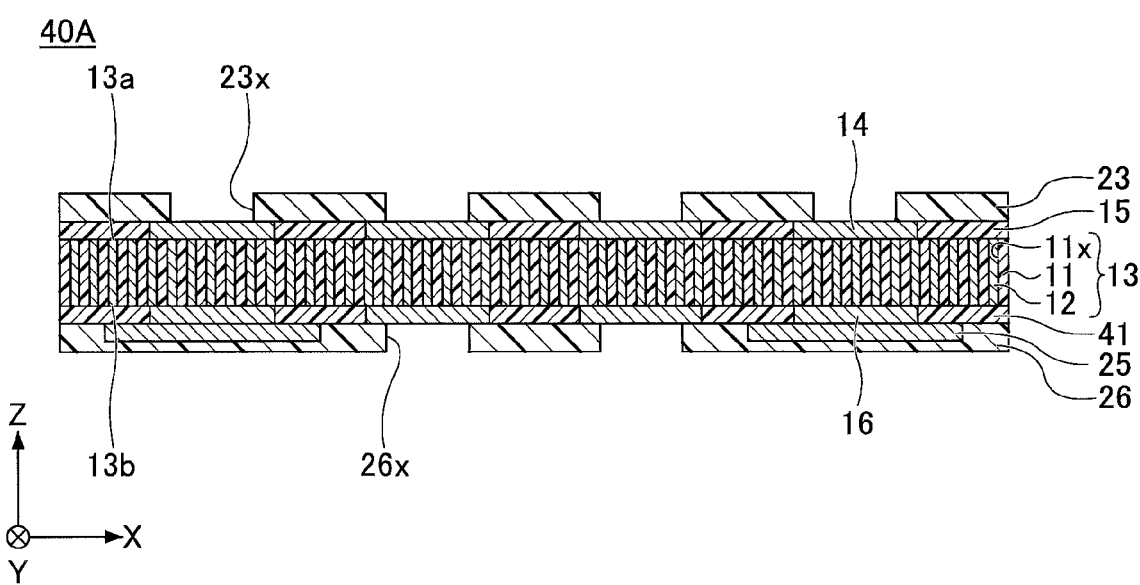
FIG. 16 is a cross-sectional view illustrating a wiring substrate according to a modified example of the third embodiment.

FIG. 16 is a cross-sectional view illustrating a wiring substrate 40A according to the modified example of the third embodiment. As illustrated in FIG. 16, the wiring substrate 40A of the modified example of the third embodiment is different from the wiring substrate 40 of the third embodiment (see FIG. 11) in that the second insulating layer 21, the third wiring layer 22, and the fourth insulating layer 42 are omitted.

In other words, the wiring substrate 40A has the first wiring layer 14 formed in predetermined areas on the one surface 13a of the core layer 13. Further, the first insulating layer 15 having substantially the same thickness as the first wiring layer 14 is formed in areas of the one surface 13a of the core layer 13 where the first wiring layer 14 is not formed. Further, the solder resist layer 23 having the opening parts 23x formed therein is layered on the flat surface constituted by the upper surface of the first insulating layer 15 and the upper surface of the first wiring layer 14.

Further, the second wiring layer 16 is formed in predetermined areas on the other surface 13b of the core layer 13. Further, the third insulating layer 41 having substantially the same thickness as the second wiring layer 16 is formed in areas of the other surface 13b of the core layer 13 where the second wiring layer 16 is not formed. Further, the solder resist layer 26 having the opening parts 26x formed therein is layered on the flat surface constituted by the lower surface of the third insulating layer 41 and the lower surface of the second wiring layer 16.

The first wiring layer 14 and the second wiring layer 16 are positioned to superpose each other from a plan view. The first wiring layer 14 and the second wiring layer 16 are electrically connected to each other by way of the linear conductors 12. However, for the sake of convenience, the first and second wiring layers 14, 16 illustrated in FIG. 16 are illustrated with dimensions (e.g., diameters) different from the first and second wiring layers 14, 16 illustrated in FIG. 11.

A portion of the first wiring layer 14 is exposed in the opening parts 23x of the solder resist layer 23, and a portion of the second wiring layer 16 is exposed in the opening parts 26x of the solder resist layer 26. According to necessity, a metal layer may be formed on the upper surface of the first wiring layer 14 exposed in the opening parts 23x or the lower surface of the second wiring layer 16 exposed in the opening parts 26x. Alternatively, instead of forming the metal layer, an anti-oxidation process (e.g., OSP (Organic Solderability Preservative)) may be performed on the upper surface of the first wiring layer 14 exposed in the opening parts 23x or the lower surface of the second wiring layer 16 exposed in the opening parts 26x. Examples of the metal layer are the same as those described above.

Figure 17:
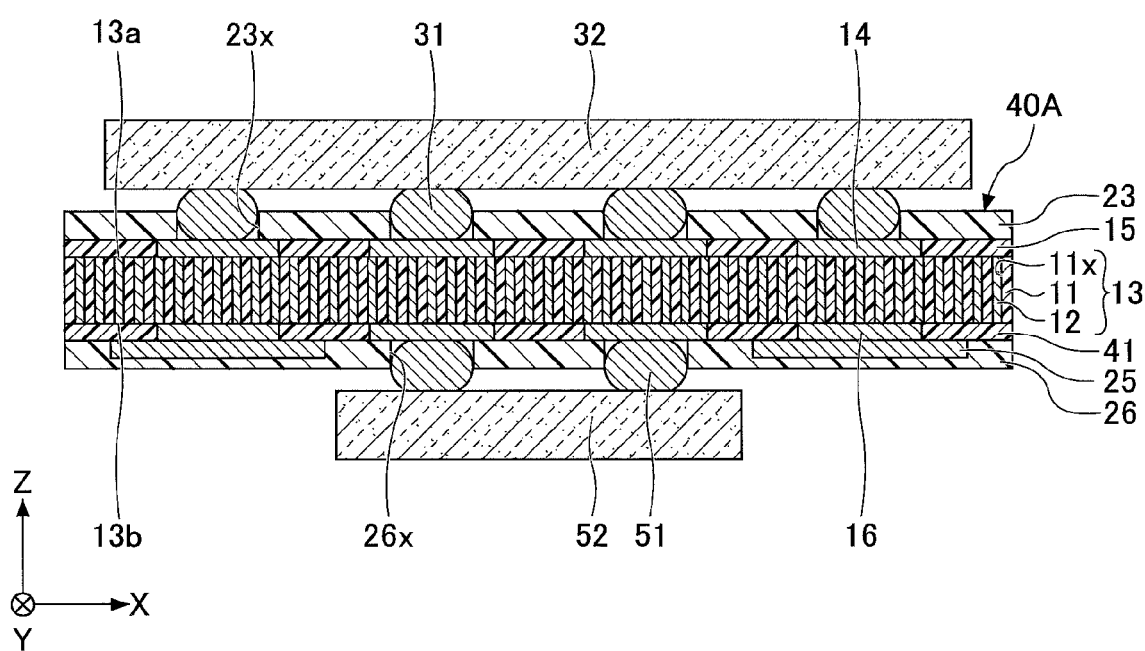
FIG. 17 is a cross-sectional view illustrating a semiconductor package according to a modified example of the third embodiment.

FIG. 17 is a cross-sectional view illustrating a semiconductor package 50A according to the modified example of the third embodiment. As illustrated in FIG. 17, the semiconductor package 50A according to the modified example of the third embodiment has the semiconductor chips 32, 52 mounted one on each surface of the wiring substrate 40A. However, for the sake of convenience, the semiconductor chips 32, 52 illustrated in FIG. 17 are illustrated with dimensions (e.g., diameters) different from the semiconductor chips 32, 52 illustrated in FIG. 12.

The semiconductor chip 32 is mounted on the one surface 13a side of the core layer 13 of the wiring substrate 40A. The electrode pads (not illustrated) of the semiconductor chip 32 are electrically connected to the first wiring layer 14 exposed in the opening parts 23x by way of the bumps 31. Further, the semiconductor chip 52 is mounted on the other surface 13b side of the core layer 13 of the wiring substrate 40A. The electrode pads (not illustrated) of the semiconductor chip 52 are electrically connected to the second wiring layer 16 exposed in the opening parts 26x by way of the bumps 51.

In other words, the semiconductor chip 32 is electrically connected to the semiconductor chip 52 by way of the bumps 31, the first wiring layer 14 exposed in the opening parts 23x, the linear conductors 12, the second wiring layer 16 exposed in the opening parts 26x, and the bumps 51. The bumps 31, the first wiring layer 14 exposed in the opening parts 23x, the linear conductors 12, the second wiring layer 16 exposed in the opening parts 26x, and the bumps 51 are positioned to superpose each other from a plan view. Therefore, the semiconductor chip 32 and the semiconductor chip 52 can be connected to each other with a minimum distance. Thus, the electric characteristics of the wiring substrate 40A can be improved.

Even in a case where one or more other insulating layers or wiring layers are provided between the solder resist layer 23 and the flat surface constituted by the upper surface of the first insulating layer 15 and the upper surface of the first wiring layer 14, the same effects attained by the above-described embodiments can also be attained by a conductive path provided in superposing positions from a plan view. Further, even in a case where one or more other insulating layers or wiring layers are provided between the solder resist layer 26 and the flat surface constituted by the lower surface of the third insulating layer 41 and the lower surface of the second wiring layer 16, the same effects attained by the above-described embodiments can also be attained by a conductive path provided in superposing positions from a plan view.

Similar to the third embodiment, the first wiring layer 14 may have a structure including the signal wirings 14a and the solid wirings 14b, and the second wiring layer 16 may have a structure including the signal wirings 16a and the solid wirings 16b.

Fourth Embodiment

The following fourth embodiment of the present invention illustrates an example in which no metal material is filled into the portions where the wiring layer is formed in the wiring substrate 10 of the first embodiment.

Structure of Wiring Substrate of Fourth Embodiment

Figure 18A:
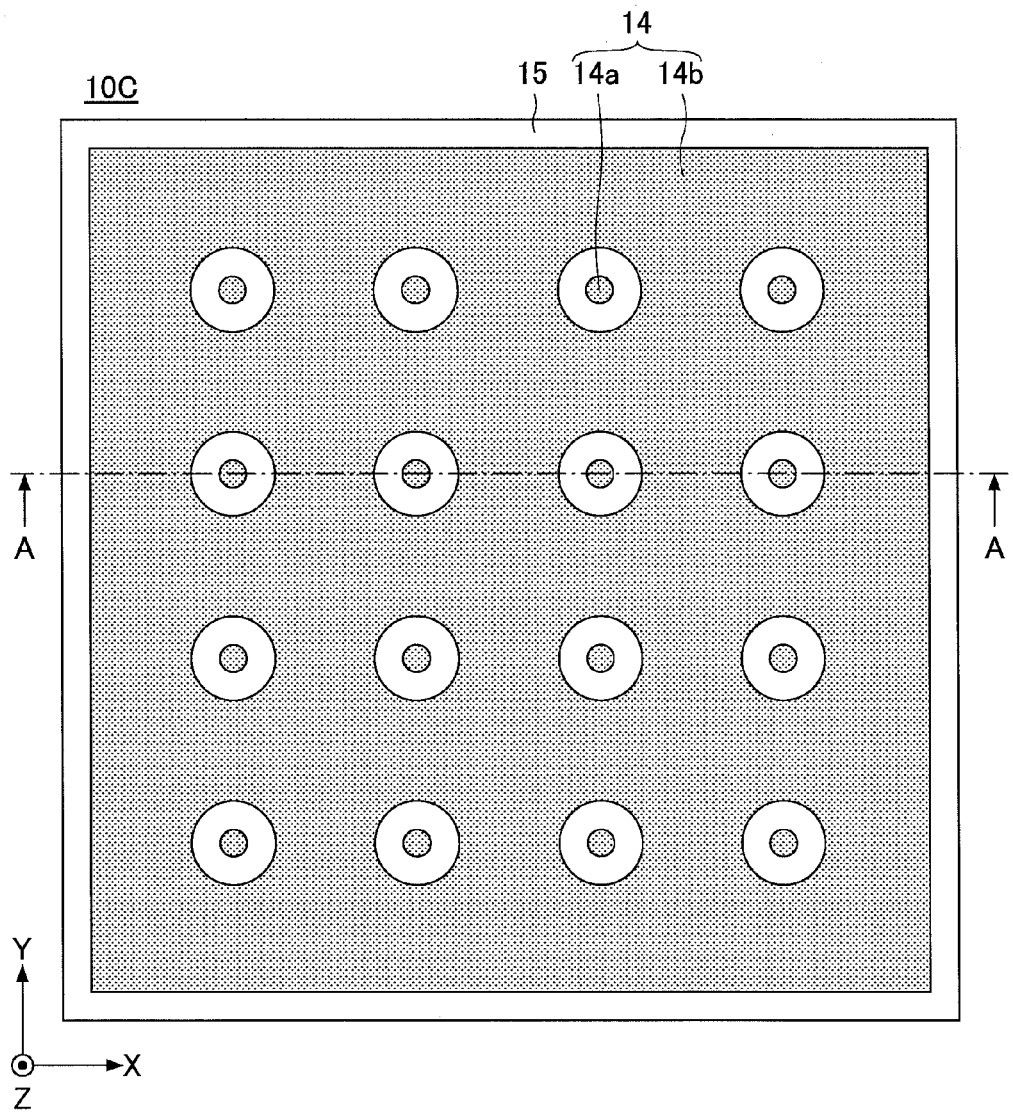
FIGS. 18A-18B are schematic diagrams illustrating a wiring substrate according to a fourth embodiment of the present invention.
Figure 18B:
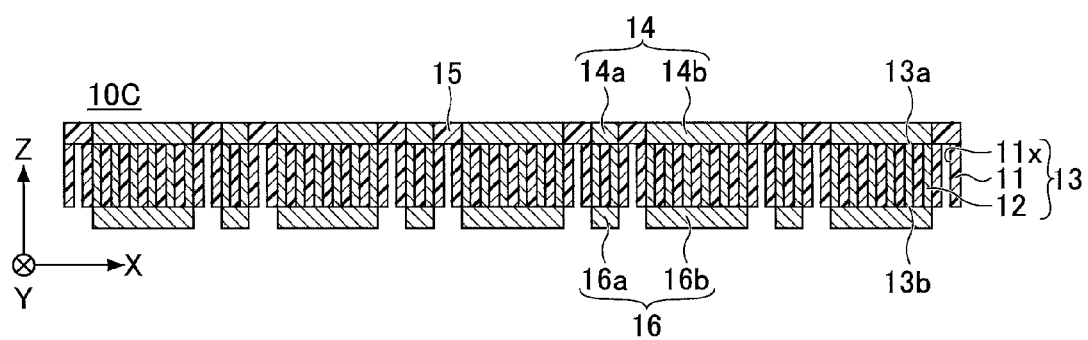

First, a structure of a wiring substrate 10C according to the fourth embodiment of the present invention is described. FIGS. 18A and 18B are diagrams illustrating the wiring substrate 10C of the fourth embodiment. FIG. 18A is a plan view of the wiring substrate 10C. FIG. 18B is a cross-sectional view of the wiring substrate 10C taken along line A-A of FIG. 18A. As illustrated in FIGS. 18A and 18B, the wiring substrate 10C of the fourth embodiment is different from the wiring substrate 10 of the first embodiment (see FIGS. 1A and 1B) in that no metal material is filled into the through-holes 11x in areas where the first and second wiring layers 14, 16 are not formed.

Figure 19:
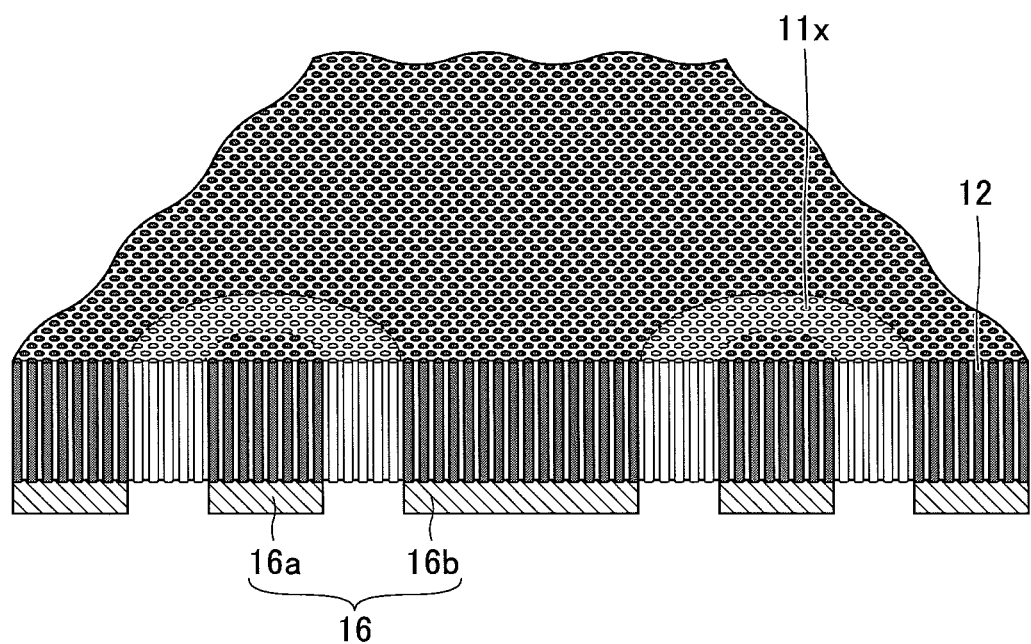
FIG. 19 is an enlarged perspective view illustrating a portion of the wiring substrate of FIGS. 18A-18B.

FIG. 19 is an enlarged perspective view illustrating a portion of the wiring substrate 10C of FIGS. 18A-18B. The illustration of the through-holes 11x, which exist in areas where the first and second wiring layers 14, 16 are not formed, is simplified in FIGS. 18A-18B. However, in reality, many through-holes 11x exist in the areas where the first and second wiring layers 14, 16 are not formed. The through-holes 11x, which exist in areas where the first and second wiring layers 14, 16 are not formed, may be hereinafter also referred to as "tubular cavities". For example, the density of the tubular cavities 11x may be not less than $4\times10^6$ cavities/mm$^2$ and not greater than $1\times10^{10}$ cavities/mm$^2$. It is to be noted that the first wiring layer and the first insulating layer 15 are not illustrated in FIG. 19.

Method for Manufacturing Wiring Substrate of Fourth Embodiment

Next, a method for manufacturing a wiring substrate according to a fourth embodiment of the present invention is described. FIGS. 20A-21C are schematic diagrams illustrating processes of the method for manufacturing a wiring substrate according to the fourth embodiment of the present invention.

Figure 20A:
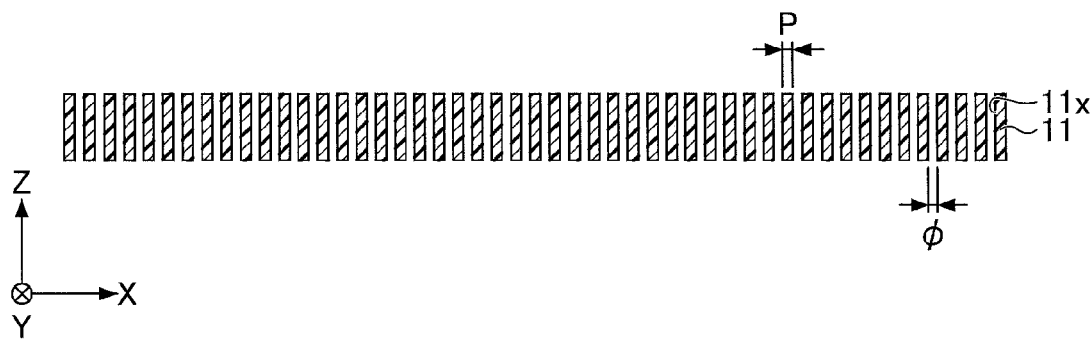
FIGS. 20A-20C are schematic diagrams illustrating processes for manufacturing the wiring substrate according to the fourth embodiment of the present invention (part 1)

First, similar to the process illustrated in FIG. 2A, a plate-shaped member 11 made of aluminum oxide (anodic aluminum oxide film) is formed with many through-holes 11x in the process illustrated in FIG. 20A.

Figure 20B:
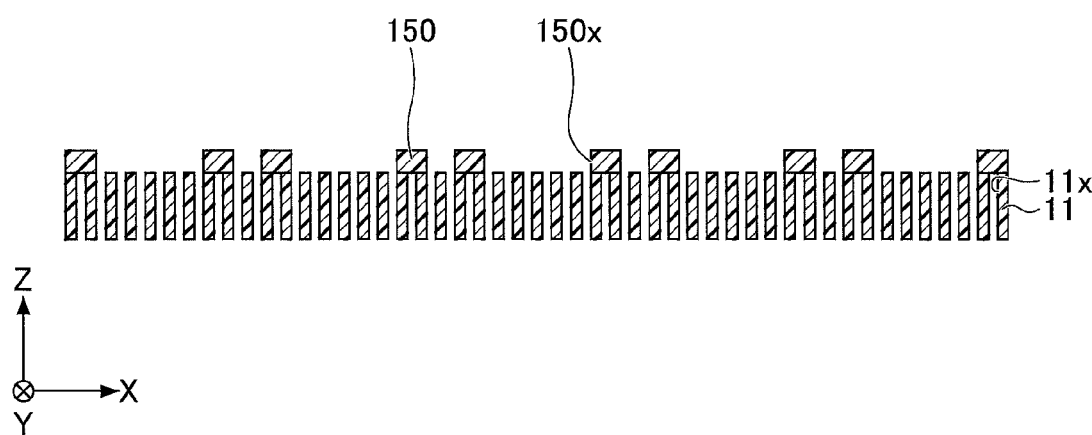

Then, similar to the process illustrated in FIG. 2C, a resist layer 150 is formed on the one surface of the plate-shaped member 11 in the process illustrated in FIG. 20B. The resist layer 150 includes opening parts 150x that expose areas on which the first wiring layer 14 is to be formed (see, FIGS. 18A-18B).

Figure 20C:
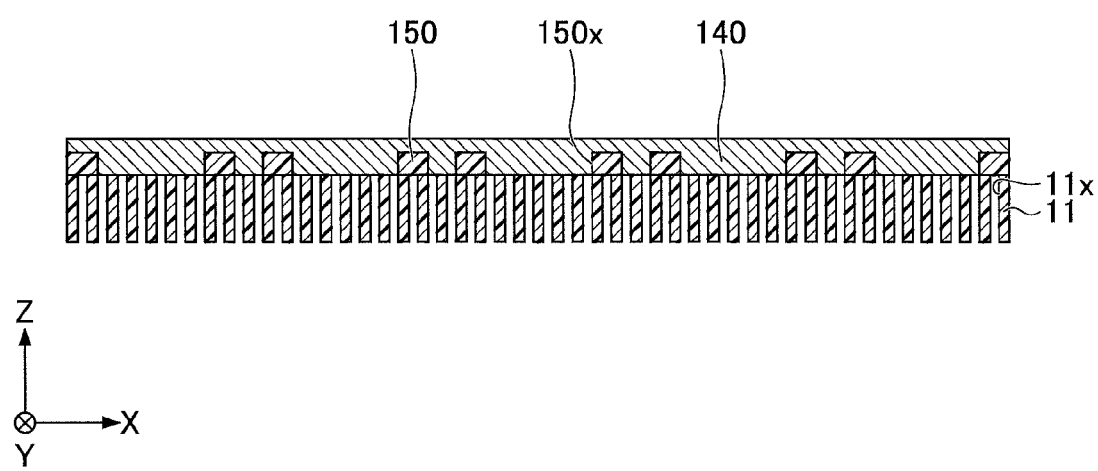

Then, similar to the process illustrated in FIG. 3A, a metal layer 140 that covers the one surface of the plate-shaped member 11 (including the resist layer 150 formed on the one surface of the plate-shaped member 11) is formed in the process illustrated in FIG. 20C. In other words, the metal layer 140 is formed on the one surface of the plate-shaped member 11 exposed in the opening parts 150x and an upper surface of the resist layer 150.

Figure 21A:
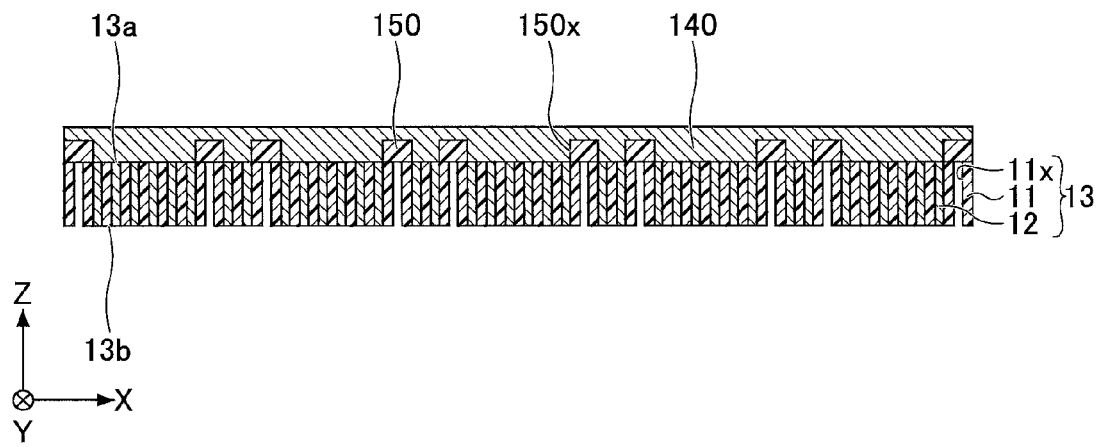
FIGS. 21A-21C are schematic diagrams illustrating processes for manufacturing the wiring substrate according to the fourth embodiment of the present invention (part 2)

Then, in the process illustrated in FIG. 21A, the linear conductors 12 are formed by filling a metal material into the through-holes 11x corresponding to areas that are not covered by the resist layer 150. Thereby, the core layer 13 is formed. More specifically, a plating film deposited on the one surface of the plate-shaped member 11 is grown by an electroplating method using the metal layer 140 as a power-feeding path. Thereby, the liner conductors 12 can be formed by filling metal material into the through-holes 11x that are not covered by the resist layer 150. On the other hand, the tubular cavities are formed by not filling metal material in the through-holes 11x that are not covered by the resist layer 150.

Figure 21B:
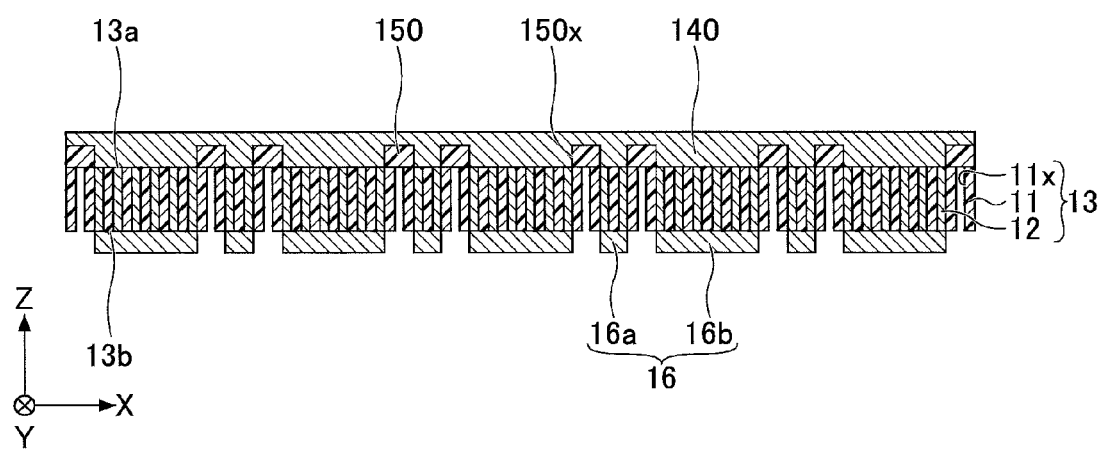

Then, in the process illustrated in FIG. 21B, the second wiring layer 16 is formed in areas of the other surface 13b of the core layer 13 that superpose with the opening parts 150x from a plan view. More specifically, a plating film deposited on the other surface 13b of the core layer 13 is grown by an electroplating method using the metal layer 140 and the liner conductors 12 connected to the metal layer 140 as a power-feeding path. Thereby, the second wiring layer 16 is formed in areas of the other surface 13b of the core layer 13 that superpose with the opening parts 150x from a plan view. According to necessity, a lower surface of the second wiring layer 16 may be planarized by, for example, polishing the lower surface of the second wiring layer 16.

The second wiring layer 16 is formed by growing the plating film only from other ends of the linear conductors 12 that have one ends electrically connected to the metal layer 140 formed in the opening parts 150x. As a result, the second wiring layer 16 can be formed in positions that accurately superpose with the metal layer 140 in the opening parts 150x from a plan view. As described above, the second wiring layer 16 is formed to include the signal wirings 16a and the solid wirings 16b surrounding the signal wirings 16a at predetermined intervals.

For the sake of convenience, the process illustrated in FIG. 21A and the process illustrated in FIG. 21B are described as separately performed processes. However, the process illustrated in FIG. 21A and the process illustrated in FIG. 21B may be performed as a single continuous process (successive process). That is, a plating film deposited on the one surface 13a of the core member 13 is grown by an electroplating method using the metal layer 140 as a power-feeding path, so that the linear conductors 12 are formed by filling metal material into the through-holes 11x that are not covered by the resist layer 150. Then, continuing from the forming of the linear conductors, an electroplating method using the metal layer 140 and the liner conductors 12 connected to the metal layer 140 as a power-feeding path, so that the second wiring layer 16 is formed in areas of the other surface 13b of the core layer 13 that superpose with the opening parts 150x from a plan view.

Figure 21C:
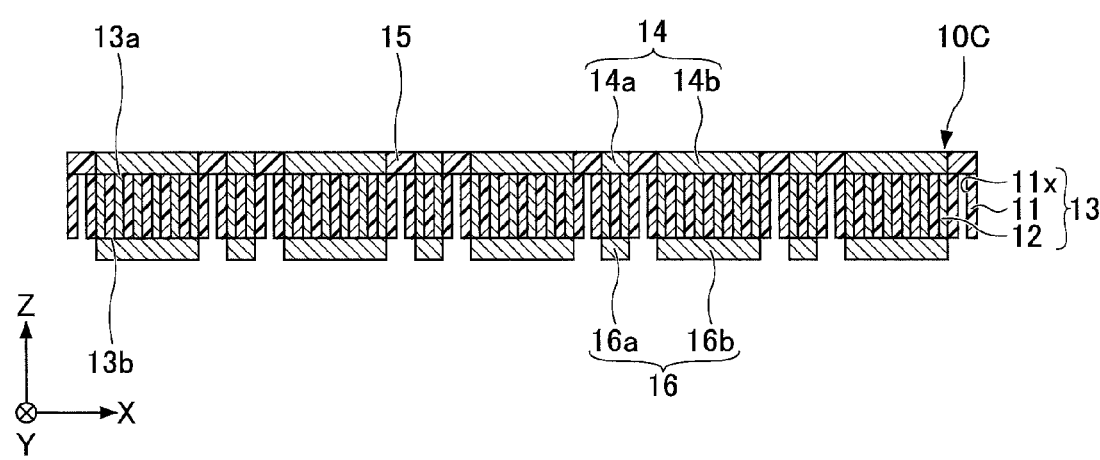

Then, in FIG. 21C, by performing a process similar to the process illustrated in FIG. 3C, the first wiring layer 14, which includes the signal wirings 14a and the solid wirings 14b surrounding the signal wirings 14a at predetermined intervals, is formed. In addition, at the same time of forming the first wiring layer 14, the first insulating layer 15 is also formed on areas of the one surface 13a of the core layer 13 where the first wiring layer 14 is not formed. The first insulating layer 15 is formed to have the same thickness as the first wiring layer 14. Accordingly, the manufacturing of the wiring substrate 10C illustrated in FIGS. 18A-18B is completed by performing the processes illustrated in FIGS. 20A-21C.

After performing the process illustrated in FIG. 21C, an additional layer such as the third insulating layer 24 of the second embodiment may be formed. Alternatively, after performing the process illustrated in FIG. 21C, an additional layer such as the third insulating layer 41 of the third embodiment may be formed. Further, after completing the manufacturing of the wiring substrate 10C, a semiconductor chip(s) may be mounted on the one surface, the other surface, or both surfaces of the wiring substrate 10C.

It is to be noted that, even in a case where the third insulating layer 24 or the third insulating layer 41 is formed on the other surface 13b of the core layer 13 by using a resin film or a resin paste, the tubular cavities maintain a substantially hollow state. This is because the tubular cavity is formed with a diameter of a nano-order and has one end sealed by the first insulating layer 15 to prevent internal gas from escaping from the tubular cavity. That is, owing to the configuration of the tubular cavity, resin can hardly enter the tubular cavity in a case where an insulating film is formed by using a resin film of low viscosity or a resin paste of low viscosity.

Accordingly, tubular cavities may be formed by not filling metal material into the through-holes 11x in the areas where the first and second wiring layers 14, 16 are not formed. Thus, in addition to attaining the effects attained by the first embodiment, the fourth embodiment can also attain the following effects. Because the air inside the tubular cavities has a dielectric constant less than that of a metal material, parasitic capacitance can be reduced by providing the tubular cavities between the signal wirings 14a, 16a and the solid wirings 14b, 16b. Thereby, the high frequency property of the wiring substrate 10C can be further improved.

Further, because the process of forming the linear conductors 12 by filling the through-holes 11x that are not covered by the resist layer 150 and the process of forming the second wiring layer 16 in areas of the other surface 13b of the core layer 13 that superpose with the opening parts 150x from a plan view, can be performed in a single successive process, the efficiency of manufacturing the wiring substrate 10C can be improved. Thus, manufacturing cost of the wiring substrate 10C can be reduced.

Further, electroplating can be restrained from horizontally growing from the linear conductors 12 connected to the metal layer 140 by forming the tubular cavities. Accordingly, the second wiring layer 16 can be formed in desired positions with greater accuracy compared to the manufacturing method of the first embodiment.

Fifth Embodiment

The following fifth embodiment of the present invention illustrates an example in which the wiring substrate 10 of the first embodiment has a recess part formed in the linear conductor 12 on the other surface 13b side of the core layer 13. In the fifth embodiment, like components are denoted with like reference numerals as those of the first-fourth embodiments and are not further explained.

Structure of Wiring Substrate of Fifth Embodiment

Figure 22A:
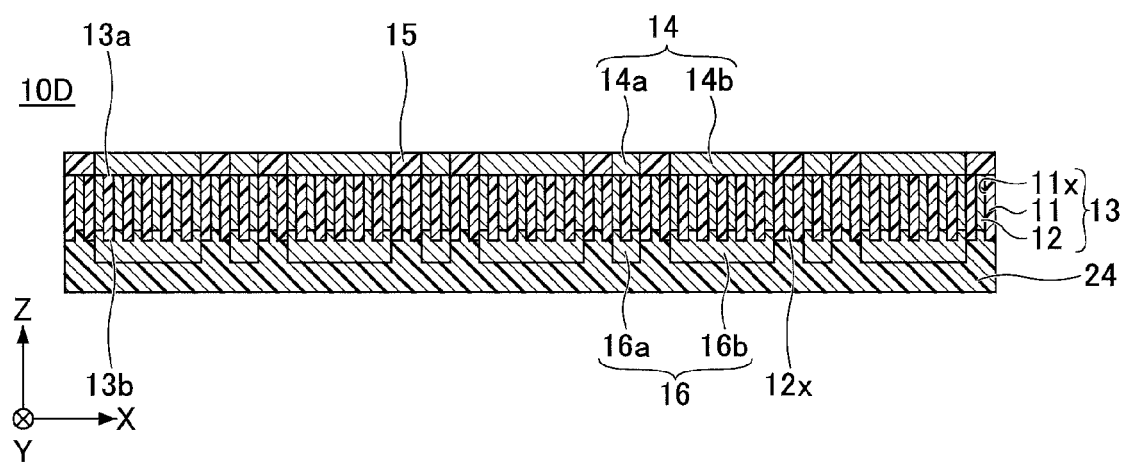
FIGS. 22A and 22B are cross-sectional diagrams illustrating a wiring substrate of according to a fifth embodiment of the present invention.
Figure 22B:
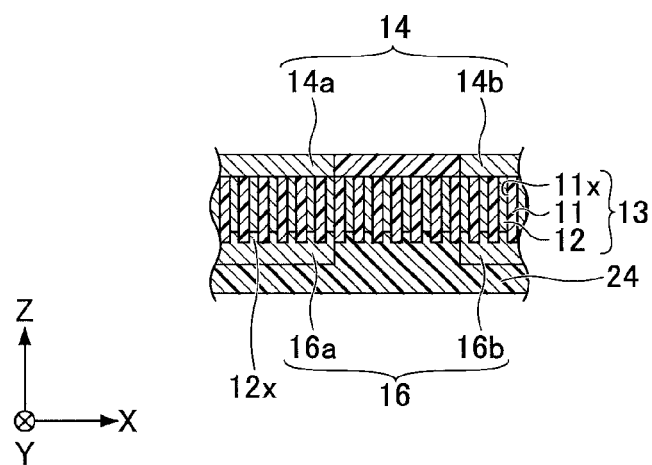

First, a structure of a wiring substrate 10D according to the fifth embodiment of the present invention is described. FIGS. 22A and 22B are cross-sectional diagrams illustrating the wiring substrate 10D of the fifth embodiment. Because a plan view of the wiring substrate 10D is substantially the same as the plan view of FIG. 1A, the plan view of the wiring substrate 10D of the fifth embodiment is omitted. FIG. 22A is a cross-sectional view of the wiring substrate 10D corresponding to FIG. 1B (cross-sectional view taken along line A-A of FIG. 1A). It is to be noted that the through-holes 11x and the linear conductors 12, which are provided in the areas where the first and second wiring layers 14, 16 are not formed, are illustrated in a simplified manner in FIG. 22A. In reality, as illustrated in FIG. 22B, many through-holes 11 and linear conductors 12 are formed in the areas where the first and second wiring layers 14, 16 are not formed.

As illustrated in FIGS. 22A and 22B, the wiring substrate 10D has a recess part 12x formed in the linear conductor 12 on the other surface 13b side of the core layer 13. In other words, the linear conductor 12 has a lower end surface (end surface on the other surface 13b side of the core layer) that is recessed (concave) relative to the other surface 13b of the core layer 13. That is, the linear conductor 12 has a lower end surface that retreats inward relative to the other surface 13b of the core layer 13. Thereby, many recess parts 12x are provided on the other surface 13b of the core layer 13. Thus, the other surface 13b of the core layer 13 is formed having fine irregularities. That is, the other surface 13b of the core layer 13 becomes a roughened surface.

The second wiring layer 16 (including the signal wirings 16a and the solid wirings 16b) is formed to dig into the recess parts 12x. Further, the third insulating layer 24 is formed on the other surface 13b of the core layer 13 to cover the second wiring layer 16. A portion of the third insulating layer 24 contacting the other surface 13b of the core layer 13 digs into the recess part 12x. Thereby, an anchor effect can be attained, so that the bond between the core layer 13 and the third insulating layer 24 can be increased.

Although the third insulating layer 24 is formed on the other surface 13b of the core layer 13 in a state illustrated in FIGS. 22A and 22B, the third insulating layer 24 may be formed at a desired timing other than that illustrated in FIGS. 22A and 22B. For example, a wiring substrate may be shipped having the below-described configuration illustrated in FIG. 23C. Thus, in this case, the increased bonding effect between the core layer 13 and the third insulating layer 24 is attained at the timing when the third insulating layer 24 is formed on the other surface 13b of the core layer 13.

Method for Manufacturing Wiring Substrate of Fifth Embodiment

Figure 23A:
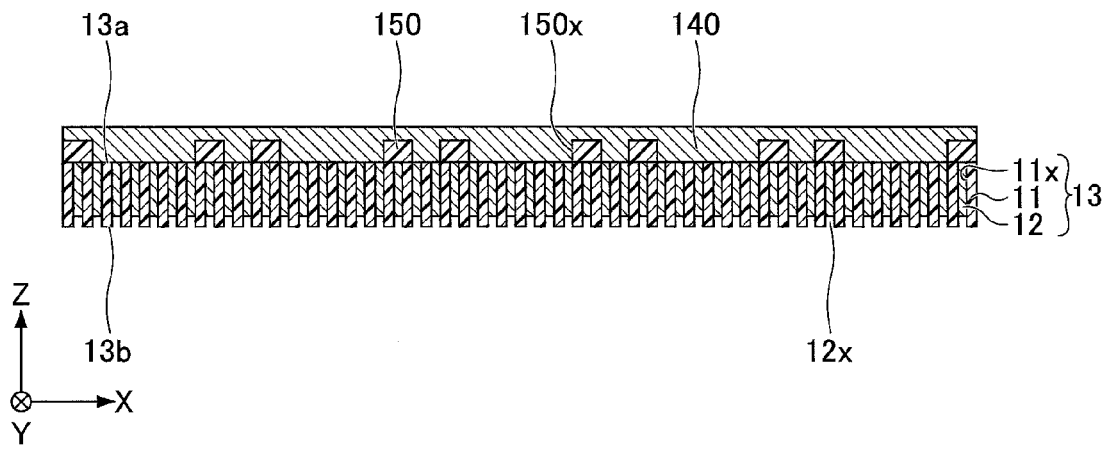
FIGS. 23A-23C are schematic diagrams illustrating processes of a method for manufacturing a wiring substrate according to the fifth embodiment of the present invention.
Figure 23B:
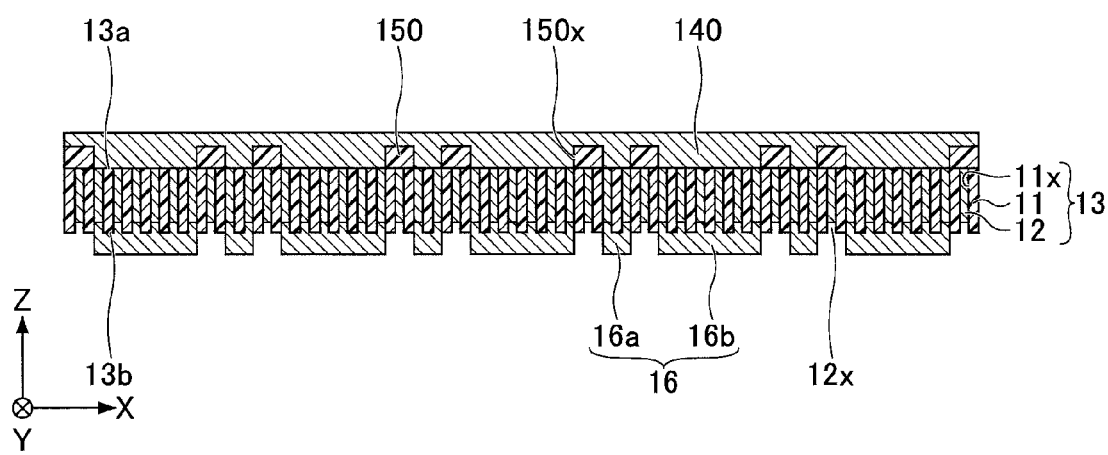
Figure 23C:
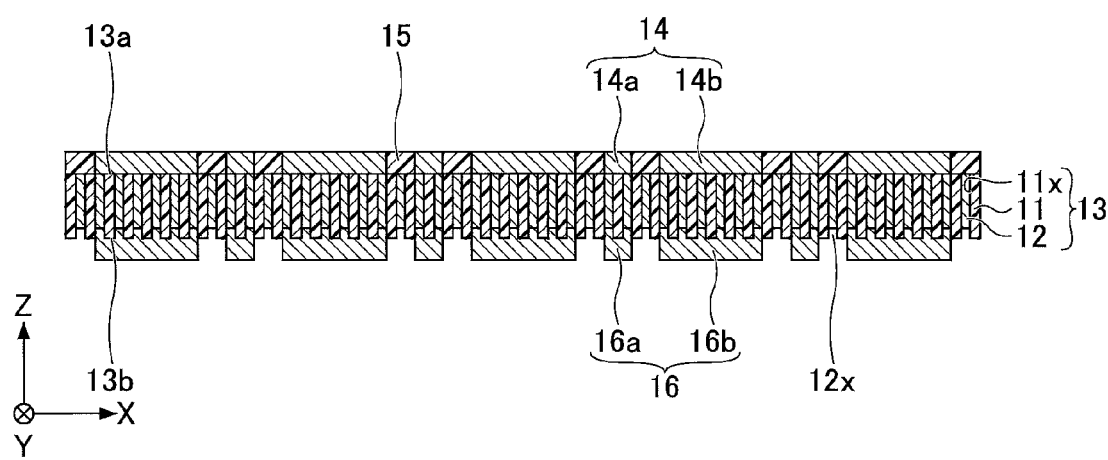

Next, a method for manufacturing a wiring substrate according to a fifth embodiment of the present invention is described. FIGS. 23A-23C are schematic diagrams illustrating processes of the method for manufacturing a wiring substrate according to the fifth embodiment of the present invention.

First, similar to the processes illustrated in FIGS. 2A-3A, a structural body illustrated in FIG. 3A is formed. Then, in the process illustrated in FIG. 23A, an etching process is performed on the structural body of FIG. 3A. That is, etching is selectively performed on the linear conductors 12 of the core layer 13 on the other surface 13b side of the core layer 13, so that the recess parts 12x are formed in the linear conductors 12 on the other surface 13b side of the core layer 13. The linear conductors 12 may be etched by using, for example, sulfuric acid.

Thereby, the lower end surface of the linear conductor 12 (end surface on the other surface 13b side of the core layer 13) becomes recessed relative to the other surface 13b of the core layer 13. That is, the lower end surface of the linear conductor 12 retreats inward relative to the other surface 13b of the core layer 13. In other words, many recess parts 12x are formed in the other surface 13b of the core layer 13. Thereby, the other surface 13b of the core layer 13 is formed having fine irregularities. That is, the other surface 13b becomes a roughed surface. The depth of the recess part 12x may be, for example, approximately 0.1 μm to 1.0 μm (depth from the other surface 13b of the core layer 13 to the lower end surface of the linear conductor 12).

It is to be noted that, because the upper surface of the metal layer 140 is etched at the same time of the etching of the linear conductors 12, the metal layer 140 is preferred to have a sufficient thickness with anticipation of the amount in which the metal layer 140 is to be etched. Alternatively, the etching of the linear conductors 12 may be performed after the upper surface of the metal layer 140 is masked. In this case, the metal layer 140 may be thin because the upper surface of the metal layer 140 is prevented from being etched.

Then, similar to the process illustrated in FIG. 3B, the second wiring layer 16 is formed in the process illustrated in FIG. 23B. That is, the second wiring layer 16 is formed in areas of the other surface 13b of the core layer 13 that superpose the opening parts 150x from a plan view. Owing to the fine irregularities (roughened surface) of the other surface 13b of the core layer 13 having many recess parts 12x, the second wiring layer 16 (including the signal wirings 16a and the solid wirings 16b) is formed to dig into the recess parts 12x. According to necessity, the lower surface of the second wiring layer 16 may be flattened by, for example, a polishing process.

Then, similar to the process illustrated in FIG. 3C, the first wiring layer 14 and the first insulating layer 15 are formed in the process illustrated in FIG. 23C. That is, the first wiring layer 14 is formed from the metal layer 140 and the first insulating layer 15 is formed from the resist layer 150 by polishing the upper surface of the metal layer 140 until the upper surface of the resist layer 150 becomes exposed. During this process, a portion of the upper surface of the resist layer 150 may also be polished. As a result, the first wiring layer 14, which includes the signal wirings 14a and the solid wirings 14b surrounding the signal wirings 14a at predetermined intervals, is formed. In addition, at the same time of forming the first wiring layer 14, the first insulating layer 15 is also formed on areas of the one surface 13a of the core layer 13 where the first wiring layer 14 is not formed. The first insulating layer 15 is formed to have the same thickness as the first wiring layer 14.

Then, similar to the process illustrated in FIG. 8A, the third insulating layer 24 is formed in the process illustrated in FIG. 23C. That is, the third insulating layer 24 is formed on the other surface 13b of the core layer 13 to cover the second wiring layer 16. Owing to the fine irregularities (roughened surface) of the other surface 13b of the core layer 13 having many recess parts 12x, a portion of the third insulating layer 24 contacting the other surface 13b of the core layer 13 is formed to dig into the recess part 12x (see FIGS. 22A and 22B). Thereby, an anchor effect can be attained, so that the bond between the core layer 13 and the third insulating layer 24 can be increased.

Hence, according to the fifth embodiment of the present invention, the linear conductors 12 may have recess parts 12x provided on the other surface 13b side of the core layer 13. Because the other surface 13b of the core layer 13 becomes a roughened surface, a portion of the third insulating layer 24 contacting the other surface 13b of the core layer 13 can be formed to dig into the recess part 12x. Thus, an anchor effect can be attained, so that the bond between the core layer 13 and the third insulating layer 24 can be increased.

Further, the second wiring layer 16 can be formed in desired positions with greater accuracy compared to the manufacturing method of the first embodiment.

As described above, with the manufacturing method of the first embodiment, a plating film deposited on the one surface 13a of the core layer 13 is grown by an electroplating method using the metal layer 140 and the linear conductors 12 as a power-feeding path. As a result, the second wiring layer 16 can be formed in positions that are accurately superposed with the first wiring layer 14 (metal layer 140 in the opening parts 150x) from a plan view.

However, as described above, the linear conductors 12 are formed in, for example, circular shapes having extremely small diameters (e.g., diameters of approximately 0.1 μm to 1

μm). Further, the linear conductors 12 are preferred to be densely formed, so that an interval between adjacent linear conductors 12 is less than the diameter of the linear conductor 12. Thus, the intervals between adjacent linear conductors are extremely small.

Therefore, on the other surface 13b side of the core layer 13, electroplating may not only grow in a vertical direction but also in a horizontal direction from the linear conductors 12 electrically connected to the metal layer 140 during the process of forming the second wiring layer 16. Thus, the electroplating may spread to the lower end surface of the linear conductors 12 that are not electrically connected to the metal layer 140. Assuming a case where the electroplating continues to grow horizontally and spreads on the lower end surface of the linear conductors 12 that are not electrically connected to the metal layer 140, the outer boundary of the second wiring layer 16 would not be clear. As a result, short-circuiting of adjacent second wiring layers 16 may occur.

In the manufacturing method of the fifth embodiment, the recess parts 12x are provided in the linear conductors 12. However, among the linear conductors 12, the linear conductors 12, which are electrically connected to the metal layer 140, have electroplating filling and growing in the recess parts 12x, so that the second wiring layer 16 is formed on the other surface 13b of the core layer 13. In other words, the second wiring layer 16 is formed in the same manner as a case where no recess parts 12x are provided in the linear conductor 12.

On the other hand, the linear conductors 12, which are not electrically connected to the metal layer 140, have no electroplating filling in the recess parts 12x. Thus, the lower end surfaces of the linear conductors 12 are recessed relative to the other surface 13b of the core layer 13. Therefore, it becomes difficult for electroplating to grow in the horizontal direction from the linear conductors 12 that are electrically connected to the metal layer 140. In other words, by forming the linear conductors 12 with a lower end surface that is recessed relative to the other surface 13b of the core layer 13, electroplating can be prevented from growing in the horizontal direction from the linear conductors 12 that are electrically connected to the metal layer 140. Therefore, the second wiring layer 16 can be formed in desired positions with greater accuracy compared to the manufacturing method of the first embodiment.

First Modified Example of Fifth Embodiment

The following first modified example of the fifth embodiment illustrates another example of the linear conductors 12 having the recess parts 12x formed on the other surface 13b side of the core layer 13. In the first modified example of the fifth embodiment, like components are denoted with like reference numerals as those of the above-described first-fifth embodiments and are not further explained.

Figure 24A:
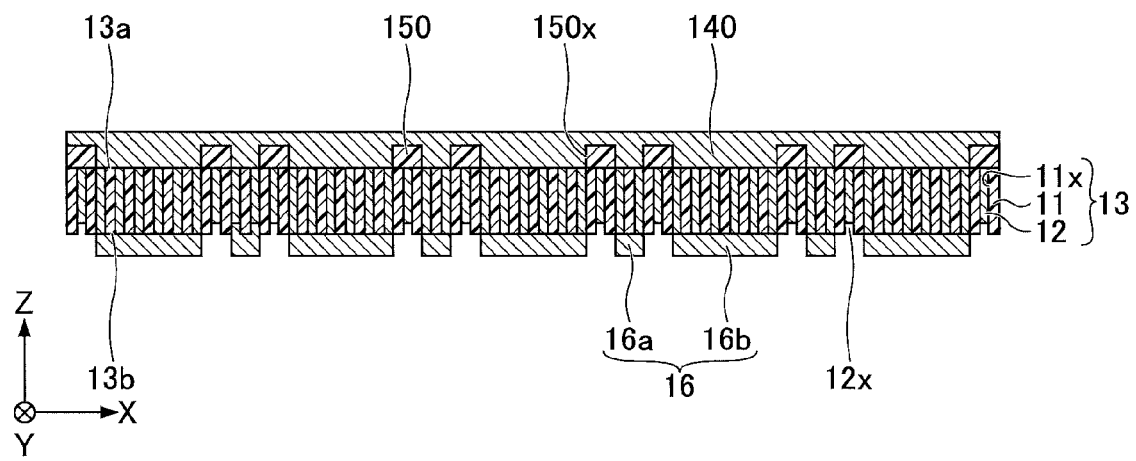
FIGS. 24A-24B are schematic diagrams illustrating processes of a method for manufacturing a wiring substrate according to a first modified example of the fifth embodiment.
Figure 24B:
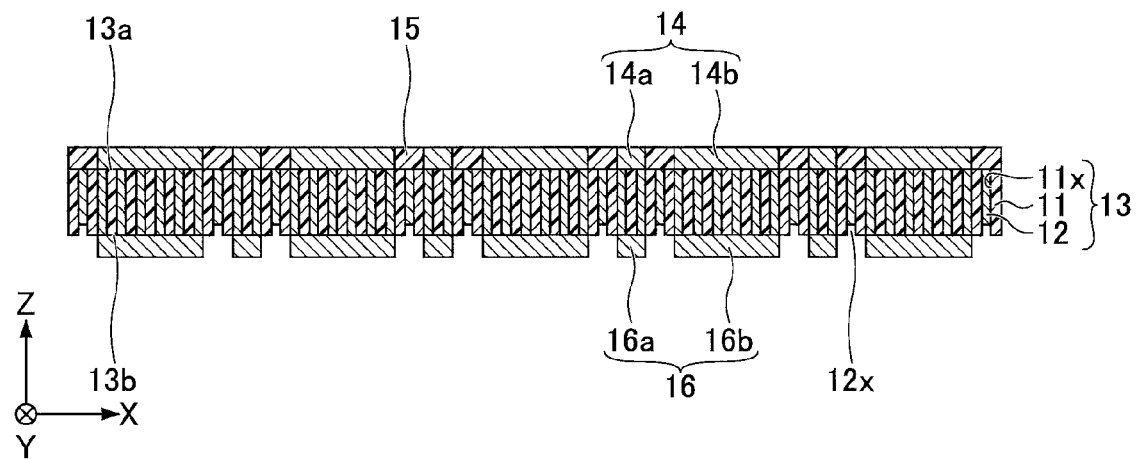

FIGS. 24A-24B are schematic diagrams illustrating processes of the method for manufacturing a wiring substrate according to the first modified example of the fifth embodiment. First, similar to the processes illustrated in FIGS. 2A-3A, a structural body illustrated in FIG. 3A is formed. Then, in the process illustrated in FIG. 24A, the second wiring layer 16 is formed in areas of the other surface 13b of the core layer 13 that superpose the opening parts 150x from a plan view. At the same time of forming the second wiring layer 16, etching is selectively performed on the other surface 13b side of the core layer 13, so that the recess parts 12x are formed in the linear conductors 12, which are not electrically connected to the metal layer 14, on the other surface 13b side of the core layer 13.

Thereby, the second wiring layer 16 is formed on the linear conductors 12, which are electrically connected to the metal layer 140, on the other surface 13b side of the core layer 13. Further, the lower end surfaces of the linear conductors 12 (end surfaces on the other surface 13b side of the core layer 13), which are not electrically connected to the metal layer 140, are recessed (retreated inward) relative to the other surface 13b of the core layer 13. In other words, many recess parts 12x are formed in areas of the other surface 13b of the core layer 13 where the second wiring layer 16 is not formed. Thereby, fine irregularities (roughened surface) can be formed in the areas of the other surface 13b of the core layer 13 where the second wiring layer 16 is not formed. The depth of the recess parts 12x (depth from the other surface 13b of the core layer 13 to the lower end surface of the linear conductors 12) may be, for example, approximately 0.1 μm to 1.0 μm.

The following method may be performed in order to form the second wiring layer 16 on the linear conductors 12, which are electrically connected to the metal layer 140, on the other surface 13b side of the core layer 13 at the same time of forming the recess parts 12x in the linear conductors 12, which are not electrically connected to the metal layer 140, on the other surface 13b side of the core layer 13. That is, such method may be to use an electroplating liquid having high dissolved oxygen density for forming the second wiring layer 16. In other words, such method may be to increase the dissolved oxygen density included in the electroplating liquid used in the process of forming the second wiring layer 16 relative to the below-described dissolved oxygen density included in a regular electroplating liquid.

By increasing the dissolved oxygen density relative to the dissolved oxygen density of the regular electroplating liquid, the lower end surface of the linear conductors 12, which are not electrically connected to the metal layer 140, is oxidized to become copper oxide. Because the electroplating liquid used for forming the second wiring layer 16 is strong acid, the copper oxide of the lower end surface of the linear conductors 12 is dissolved by the electroplating liquid. Thereby, the recess parts 12x are formed in the linear conductors 12. Further, similar to the first embodiment, the second wiring layer 16 is formed on the linear conductors, which are electrically connected to the metal layer 140, on the other surface 13b side of the core layer 13 by growing a plating film on the other surface 13b of the core layer 13.

The dissolved oxygen density of the regular electroplating liquid (e.g., electroplating liquid used in the first embodiment) is, for example, approximately 0.1 ppm to 7 ppm. However, the dissolved oxygen density of the electroplating liquid used in this embodiment is, for example, approximately 8 ppm to 20 ppm. Accordingly, by forming copper acid on the lower end surface of the linear conductors 12, which are not electrically connected to the metal layer 140, and dissolving the copper acid with the electroplating liquid, the recess parts 12x can be formed at the same time of forming the second wiring layer 16 on the lower end surface of the linear conductors 12, which are electrically connected to the metal layer 140.

The dissolved oxygen density of the electroplating liquid may be increased by, for example, introducing oxygen into the electroplating liquid by using an air bubbling method. Alternatively, an air agitation method may be performed by using insoluble anodes (e.g., iridium oxide, platinum). Alternatively, both the air bubbling method and the air agitation method may be used.

It is to be noted that, because the upper surface of the metal layer 140 is etched at the same time of the etching of the linear conductors 12, the metal layer 140 is preferred to have a sufficient thickness with anticipation of the amount in which the metal layer 140 is to be etched. Alternatively, the etching of the linear conductors 12 may be performed after the upper surface of the metal layer 140 is masked. In this case, the metal layer 140 may be thin because the upper surface of the metal layer 140 is prevented from being etched.

Then, similar to the process illustrated in FIG. 3C, the first wiring layer 14 and the first insulating layer 15 are formed in the process illustrated in FIG. 24B. That is, the first wiring layer 14 is formed from the metal layer 140 and the first insulating layer 15 is formed from the resist layer 150 by polishing the upper surface of the metal layer 140 until the upper surface of the resist layer 150 becomes exposed. During this process, a portion of the upper surface of the resist layer 150 may also be polished. As a result, the first wiring layer 14, which includes the signal wirings 14a and the solid wirings 14b surrounding the signal wirings 14a at predetermined intervals, is formed. In addition, at the same time of forming the first wiring layer 14, the first insulating layer 15 is also formed on areas of the one surface 13a of the core layer 13 where the first wiring layer 14 is not formed. The first insulating layer 15 is formed to have the same thickness as the first wiring layer 14.

Then, similar to the process illustrated in FIG. 8A, the third insulating layer 24 is formed in the process illustrated in FIG. 24B. That is, the third insulating layer 24 is formed on the other surface 13b of the core layer 13 to cover the second wiring layer 16. Owing to the fine irregularities (roughened surface) of the other surface 13b of the core layer 13 having many recess parts 12x, a portion of the third insulating layer 24 contacting the other surface 13b of the core layer 13 is formed to dig into the recess part 12x (see FIGS. 22A and 22B). Thereby, an anchor effect can be attained, so that the bond between the core layer 13 and the third insulating layer 24 can be increased.

Hence, according to the first modified example of the fifth embodiment, the second wiring layer 16 can be formed on the lower end surface of the linear conductors 12, which are electrically connected to the metal layer 140 at the same time of forming the recess parts 12x in the linear conductors 12, which are not electrically connected to the metal layer 140, on the other surface 13b side of the core layer 13. Same as the above-described fifth embodiment, electroplating can be prevented from growing in the horizontal direction from the linear conductors 12 that are electrically connected to the metal layer 140. Therefore, the second wiring layer 16 can be formed in desired positions with an improved accuracy.

Unlike the fifth embodiment, the first modified example of the fifth embodiment does not require a process of forming recess parts 12x before forming the second wiring layer 16. Therefore, the manufacturing method of the first modified example of the fifth embodiment can be simplified compared to the manufacturing method of the fifth embodiment. Further, the manufacturing method of the first modified example of the fifth embodiment is preferable because there is no need to select or develop an etching liquid for selectively etching the linear conductors 12 of the core layer 13.

Second Modified Example of Fifth Embodiment

A second modified example of the fifth embodiment of the present invention also illustrates an example of forming the second wiring layer 16 at the same time of forming recess parts 12x in the linear conductors 12 but with a different method as that of the first modified example of the fifth embodiment. In the second modified example of the fifth embodiment, like components are denoted with like reference numerals as those of the above-described first-fifth embodiments and are not further explained.

The following method may also be performed in order to form the second wiring layer 16 on the linear conductors 12, which are electrically connected to the metal layer 140, on the other surface 13b side of the core layer 13 at the same time of forming the recess parts 12x in the linear conductors 12, which are not electrically connected to the metal layer 140, on the other surface 13b side of the core layer 13. That is, instead of increasing the dissolved oxygen density included in the electroplating liquid used in the process of forming the second wiring layer 16 relative to the dissolved oxygen density included in a regular electroplating liquid, ferric ions ($Fe^{3+}$) may be contained in the electroplating liquid used in the process of forming the second wiring layer 16. In this case, the dissolved oxygen density need not be increased.

Owing to the ferric ions ($Fe^{3+}$) contained in the electroplating liquid, a reaction of $2Fe^{3+}+Cu \rightarrow 2Fe^{2+}+Cu^{2+}$ is generated during an electroplating process. That is, copper is ionized and dissolves in the electroplating liquid when reducing ferric ions ($Fe^{3+}$) to ferrous ions ($Fe^{2+}$).

Because the amount of electrodeposition during the electroplating process is greater than the amount of copper dissolved by the aforementioned reaction, plating is deposited on the linear conductors 12, which are electrically connected to the metal layer 140, on the other surface 13b side of the core layer 13. Thereby, the second wiring layer 16 is formed on the linear conductors 12, which are electrically connected to the metal layer 140, on the other surface 13b side of the core layer 13. On the other hand, plating is not deposited on the linear conductors 12, which are electrically connected to the metal layer 140, on the other surface 13b side of the core layer 13. That is, only dissolving of ionized copper occurs on the linear conductors 12, which are not electrically connected to the metal layer 140, on the other surface 13b side of the core layer 13. Therefore, the recess parts 12x are formed in the linear conductors 12, which are not electrically connected to the metal layer 140, on the other surface 13b side of the core layer 13.

It is to be noted that the regular electroplating liquid used, for example, in the first embodiment does not contain ferric ion ($Fe^{3+}$). In this second modified example, the amount of ferric ions ($Fe^{3+}$) contained in the electroplating liquid used for forming the second wiring layer 16 is preferably 0.01 g/L to 7 g/L. Further, the amount of ferric ions ($Fe^{3+}$) contained in the electroplating liquid used for forming the second wiring layer 16 is more preferably 0.1 g/L to 2 g/L. These amounts are preferred for sufficiently etching the linear conductors 12 without impeding the forming of the second wiring layer 16.

Accordingly, instead of increasing the dissolved oxygen density included in the electroplating liquid used in the process of forming the second wiring layer 16 relative to the dissolved oxygen density included in a regular electroplating liquid, ferric ions ($Fe^{3+}$) may be contained in the electroplating liquid used in the process of forming the second wiring layer 16. Alternatively, $Co^{3+}$, $Ti^{3+}$, or $Mn^{3+}$ may be used instead of $Fe^{3+}$. The same effects can be attained as the above-described second modified example where $Co^{3+}$, $Ti^{3+}$, or $Mn^{3+}$ is used instead of $Fe^{3+}$.

Third Modified Example of Fifth Embodiment

The following third modified example of the fifth embodiment illustrates an example of the linear conductors 12 having the recess parts 12x formed on the one surface 13a side and the other surface 13b side of the core layer 13 in the wiring substrate of the first embodiment. In the third modified example of the fifth embodiment, like components are denoted with like reference numerals as those of the above-described first-fifth embodiments and are not further explained.

Structure of Wiring Substrate of Third Modified Example of Fifth Embodiment

Figure 25:
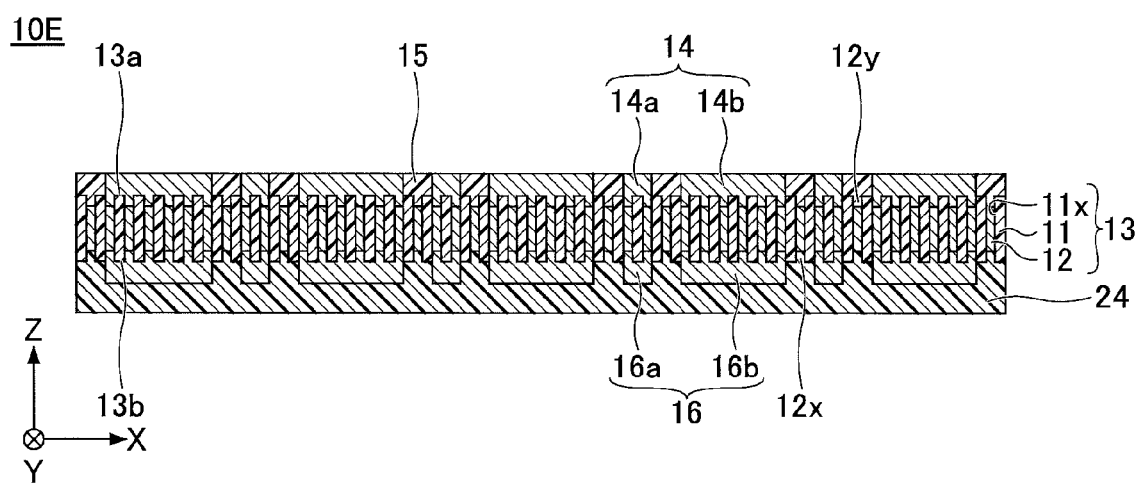
FIG. 25 is a cross-sectional diagram illustrating a wiring substrate of a third modified example of the fifth embodiment.

First, a structure of a wiring substrate 10E according to the third modified example of the fifth embodiment of the present invention is described. FIG. 25 is a cross-sectional diagram illustrating the wiring substrate 10E of the third modified example of the fifth embodiment. Because a plan view of the wiring substrate 10E is substantially the same as the plan view of FIG. 1A, the plan view of the wiring substrate 10E of the third modified example of the fifth embodiment is omitted. FIG. 25 is substantially equivalent to the cross-sectional view illustrated in FIG. 1B. It is to be noted that the through-holes 11x and the linear conductors 12, which are provided in the areas where the first and second wiring layers 14, 16 are not formed, are illustrated in a simplified manner in FIG. 25. In reality, as illustrated in FIG. 22B, many through-holes 11 and linear conductors 12 are formed in the areas where the first and second wiring layers 14, 16 are not formed.

As illustrated in FIG. 25, the wiring substrate 10E of the third modified example is different from the wiring substrate 10D of the fifth embodiment (see FIGS. 22A and 22B) in that recess parts 12y are also formed in the linear conductors 12 on the one surface 13a side of the core layer 13. The wiring substrate 10E has a recess part 12y formed in the linear conductor 12 on the one surface 13a side of the core layer 13. In other words, the linear conductor 12 has an upper end surface (end surface on the one surface 13a side of the core layer) that is recessed (concave) relative to the one surface 13a of the core layer 13. That is, the linear conductor 12 has an upper end surface that retreats inward relative to the one surface 13a of the core layer 13. Thereby, many recess parts 12y are provided on the one surface 13a of the core layer 13. Thus, the one surface 13a of the core layer 13 is formed having fine irregularities. That is, the one surface 13a of the core layer 13 becomes a roughened surface.

The first wiring layer 14 (including the signal wirings 14a and the solid wirings 14b) is formed to dig into the recess parts 12y. Further, the first insulating layer 15, which is formed on the one surface 13a of the core layer 13 in the areas where the first wiring layer 14 is not formed, also digs into the recess parts 12y. Thereby, an anchor effect can be attained, so that the bond between the core layer 13 and the first insulating layer 15 can be increased.

Figure 26:
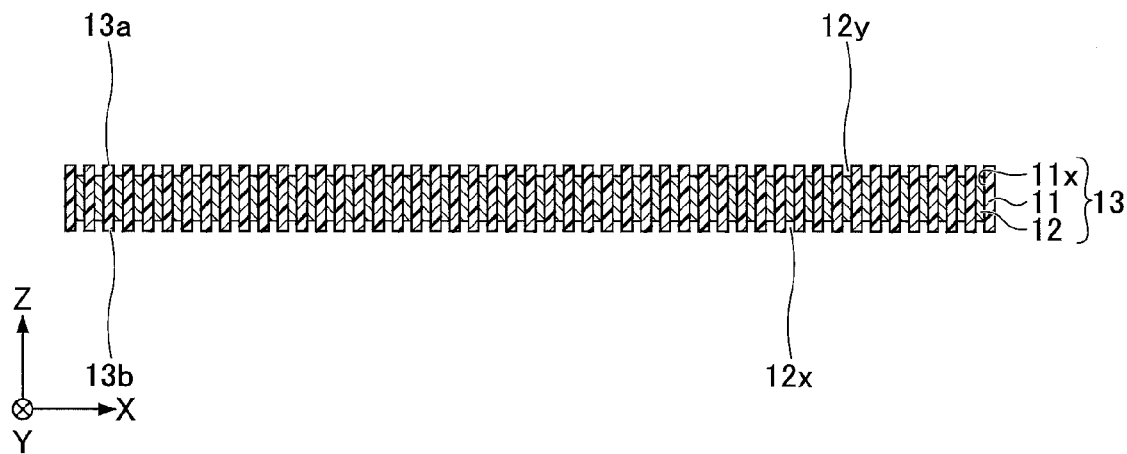
FIG. 26 is a schematic diagram illustrating processes of the method for manufacturing a wiring substrate according to the third modified example.

Method for Manufacturing Wiring Substrate of Third Modified Example of Fifth Embodiment Next, a method for manufacturing a wiring substrate according to the third modified example of the fifth embodiment of the present invention is described. FIG. 26 is a schematic diagram illustrating processes of the method for manufacturing a wiring substrate according to the third modified example of the fifth embodiment of the present invention.

First, similar to the processes illustrated in FIGS. 2A-2B, the core layer 13 is formed. Then, in the process illustrated in FIG. 26, an etching process is performed on the core layer 13. That is, etching is selectively performed on the linear conductors 12 of the core layer 13 on the one surface 13a side and the other surface 13b side of the core layer 13. Thereby, the recess parts 12y are formed in the linear conductors 12 on the one surface 13a side of the core layer 13 along with the recess parts 12x formed in the linear conductors 12 on the other surface 13b side of the core layer 13. The linear conductors 12 may be etched by using, for example, sulfuric acid.

Thereby, the upper end surface of the linear conductor 12 (end surface on the one surface 13a side of the core layer 13) becomes recessed relative to the one surface 13a of the core layer 13. That is, the upper end surface of the linear conductor 12 retreats inward relative to the one surface 13a of the core layer 13. Further, the lower end surface of the linear conductor 12 (end surface on the other surface 13b side of the core layer 13) becomes recessed relative to the other surface 13b of the core layer 13. That is, the lower end surface of the linear conductor 12 retreats inward relative to the other surface 13b of the core layer 13. In other words, many recess parts 12y are formed in the one surface 13a of the core layer 13. Thereby, the one surface 13a of the core layer 13 is formed having fine irregularities. That is, the one surface 13a of the core layer 13 becomes a roughed surface. Further, many recess parts 12x are formed in the other surface 13b of the core layer 13. Thereby, the other surface 13b of the core layer 13 is formed having fine irregularities. That is, the other surface 13b of the core layer 13 becomes a roughed surface. The depth of each of the recess parts 12x, 12y may be, for example, approximately 0.1 μm to 1.0 μm.

Then, processes similar to the processes illustrated in FIGS. 2C-3C of the first embodiment are performed. Then, similar to the process illustrated in FIG. 8A, the third insulating layer 24 is formed on the other surface 13b of the core layer 13 to cover the second wiring layer 16. Thereby, manufacturing of the wiring substrate 10E is completed (see FIG. 25).

As described in the third modified example, the first wiring layer 14 or the first insulating layer 15 may be formed after the forming of the recess parts 12y in the linear conductors 12 on the one surface 13a side of the core layer 13 and the forming of the recess parts 12x in the linear conductors 12 on the other surface 13b side of the core layer 13. Thereby, the third modified example can attain the following effects in addition to attaining the above-described effects of the fifth embodiment. That is, owing to the fine irregularities (roughened surface) of the one surface 13a of the core layer 13 having many recess parts 12y, a portion of the first insulating layer 15 contacting the one surface 13a of the core layer 13 is formed to dig into the recess part 12y. Thereby, an anchor effect can be attained, so that the bond between the core layer 13 and the first insulating layer 15 can be increased.

Various aspects of the subject-matter described herein are set out non-exhaustively in the following numbered clauses:

1. A method for manufacturing a wiring substrate, comprising:

forming a core layer having one and another surfaces and including a plate-shaped member formed of an aluminum oxide and a plurality of linear conductors penetrating the plate-shaped member in a thickness direction of the plate-shaped member;

forming a resist layer on the one surface of the core layer, the resist layer including an opening part that exposes an area of the one surface of the core layer on which a first wiring layer is to be formed;

forming a metal layer entirely covering the one surface of the core layer including the resist layer;

forming a second wiring layer on the other surface of the core layer by an electroplating method using the metal layer and the plurality of linear conductors connected to the metal layer as a power-feeding path, the second wiring layer being formed in an area that superposes the opening part from a plan view; and forming the first wiring layer from the metal layer together with forming a first insulating layer from the resist layer by polishing the metal layer until an upper surface of the resist layer becomes exposed;

wherein the first insulating layer has a same thickness as the first wiring layer and is formed in an area of the one surface of the core layer on which the first wiring layer is not formed.

2. The method of clause 1, further comprising:

forming an end surface, that is recessed relative to the other surface of the core layer, in the plurality of linear conductors on the other surface side of the core layer, wherein the forming of the end surface is performed between the forming of the metal layer and the forming of the second wiring layer.

3. The method of clause 1, further comprising:

forming an end surface in the plurality of linear conductors that are not connected to the metal layer, on the other surface side of the core layer, wherein the end surface is recessed relative to the other surface of the core layer, wherein the forming of the end surface is performed at the same time of the forming of the second wiring layer.

4. The method of clause 1, further comprising:

forming an end surface, that is recessed relative to the other surface of the core layer, in the plurality of linear conductors on the other surface side of the core layer, wherein the forming of the end surface is performed between the forming of the core layer and the forming of the resist layer.

5. The method of clause 1, further comprising:

forming a second insulating layer including a through-hole and covering an upper surface of the first wiring layer and an upper surface of the first insulating layer; and forming a third wiring layer formed on an upper surface of the second insulating layer and electrically connected to the first wiring layer by way of the through-hole;

wherein the second insulating layer has a thickness that is not greater than a thickness of the first wiring layer.

6. A method for manufacturing a wiring substrate, comprising:

forming a plate-shaped member formed of an aluminum oxide having one and another surfaces and including a plurality of through-holes;

forming a resist layer on the one surface of the plate-shaped member, the resist layer including an opening part that exposes an area of the one surface of the plate-shaped member on which a first wiring layer is to be formed;

forming a metal layer entirely covering the one surface of the plate-shaped member including the resist layer;

forming a core layer including the plate-shaped member and a plurality of linear conductors by an electroplating method using the metal layer as a power-feeding path, so that a metal material fills the plurality of through-holes that are not covered by the resist layer;

forming a second wiring layer on the other surface of the plate-shaped member by an electroplating method using the metal layer and the plurality of linear conductors connected to the metal layer as a power-feeding path, so that the second wiring layer is formed in an area that superposes the opening part from a plan view; and forming the first wiring layer from the metal layer together with forming a first insulating layer from the resist layer by polishing the metal layer until an upper surface of the resist layer becomes exposed;

wherein the first insulating layer has a same thickness as the first wiring layer and is formed in an area of the one surface of the plate-shaped member on which the first wiring layer is not formed, wherein the forming of the core layer and the forming of the second wiring layer are performed as a single successive process.

7. The method of clause 6, further comprising:

forming a second insulating layer including a through-hole and covering an upper surface of the first wiring layer and an upper surface of the first insulating layer; and forming a third wiring layer formed on an upper surface of the second insulating layer and electrically connected to the first wiring layer by way of the through-hole;

wherein the second insulating layer has a thickness that is not greater than a thickness of the first wiring layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the above-described embodiments and modified examples of the embodiments may be arbitrarily combined. For example, a multilayer wiring substrate or a semiconductor package may be manufactured by using the wiring substrate 10A or 10B as described in the second and third embodiments.

Further, the fifth embodiment may be combined with the first or second modified examples of the fifth embodiment. For example, the recess parts 12x can be formed deeper during an electroplating process by forming the recess parts 12x beforehand and performing the electroplating process by using an electroplating liquid having high dissolved oxygen density or an electroplating liquid containing ferric ions. By forming the recess parts 12x with a greater depth, electroplating can be further effectively prevented from growing in the horizontal direction from the linear conductors 12 that are electrically connected to the metal layer 140. It is to be noted that the same effects can also be attained by combining the third modified example of the fifth embodiment with the first or second modified examples of the fifth embodiment.

Further, in the fifth embodiment or the first-third modified examples of the fifth embodiment, the lower surface of the third insulating layer 24 may be formed to be substantially flush with the lower surface of the second wiring layer 16 as the third insulating layer 41 of FIG. 13B, so that the lower surface of the third insulating layer 24 and the lower surface of the second wiring layer 16 constitute a flat surface as a whole.

What is claimed is:

1. A wiring substrate comprising:
a core layer having one and another surfaces and including a plate-shaped member formed of an aluminum oxide and a plurality of linear conductors penetrating the plate-shaped member in a thickness direction of the plate-shaped member;
a first wiring layer formed on the one surface of the core layer;
a second wiring layer formed on the other surface of the core layer; and
a first insulating layer having a same thickness as the first wiring layer and formed in an area of the one surface of the core layer on which the first wiring layer is not formed;
wherein the first and second wiring layers are positioned superposing each other in a plan view, wherein the first and second wiring layers are electrically connected by way of the plurality of linear conductors, wherein the plurality of linear conductors have first end surfaces provided on a side of the one surface of the core layer and second end surfaces provided on a side of the another surface of the core layer, wherein the second end surfaces are recessed relative to the another surface of the core layer, wherein the plate-shaped member includes a plurality of through-holes that are filled by the plurality of linear conductors, wherein the first end surfaces are flush with one surface of the plate-shaped member, wherein the second end surfaces are recessed relative to another surface of the plate-shaped member, so that recess parts are formed by the second end surfaces and inner wall surfaces of the plurality of through-holes, wherein the recess parts are formed on the another surface of the plate-shaped member in positions that are opposite to the first wiring layer from the plan view and positions that are opposite to the first insulating layer from the plan view, and wherein a part of the second wiring layer is formed in the recess parts in positions that are opposite to the first wiring layer from the plan view.

2. The wiring substrate as claimed in claim 1, wherein the plurality of linear conductors includes a linear conductor having one end exposed from the one surface of the core layer and another end exposed from the other surface of the core layer, wherein the one end contacts the first wiring layer and the other end contacts the second wiring layer.

3. The wiring substrate as claimed in claim 1, wherein the plurality of through-holes are formed in an area corresponding to the area in which the first insulating layer is formed, wherein the plurality of through-holes are hollow and penetrate the plate-shaped member in the thickness direction of the plate-shaped member.

4. The wiring substrate as claimed in claim 1, further comprising:

a second insulating layer including a first through-hole and covering an upper surface of the first wiring layer and an upper surface of the first insulating layer; and a third wiring layer formed on an upper surface of the second insulating layer and electrically connected to the first wiring layer by way of the first through-hole;

wherein the second insulating layer has a thickness that is not greater than a thickness of the first wiring layer.

5. The wiring substrate as claimed in claim 4, further comprising:

a third insulating layer having a same thickness as the second wiring layer and formed in an area of the other surface of the core layer on which the second wiring layer is not formed;

a fourth insulating layer including a second through-hole and covering a lower surface of the second wiring layer and a lower surface of the third insulating layer; and a fourth wiring layer formed on a lower surface of the fourth insulating layer and electrically connected to the second wiring layer by way of the second through-hole;

wherein the fourth insulating layer has a thickness that is not greater than a thickness of the second wiring layer.

6. The wiring substrate as claimed in claim 1, wherein each of the first and second wiring layers includes a signal wiring and a solid wiring surrounding the signal wiring from a plan view, wherein the solid wiring included in the first wiring layer is divided into two or more areas that are insulated from each other, wherein the solid wiring included in the second wiring layer is divided into two or more areas that are insulated from each other.

7. The wiring substrate as claimed in claim 1, further comprising:

an outermost wiring layer formed on the side of the one surface of the core layer and including a pad for mounting a semiconductor chip thereon.

8. The wiring substrate as claimed in claim 7, further comprising:

another outermost wiring layer formed on the side of the another surface of the core layer and including another pad for mounting another semiconductor chip thereon.

9. A semiconductor package comprising:

the wiring substrate of claim 7;

a bump formed on the pad of the outermost wiring layer; and the semiconductor chip mounted on the one surface side of the core layer and electrically connected to the wiring substrate by way of the bump.

10. A semiconductor package comprising:

the wiring substrate of claim 8;

a bump formed on the pad of the outermost wiring layer;

the semiconductor chip mounted on the one surface side of the core layer and electrically connected to the wiring substrate by way of the bump;

another bump formed on the pad of the other outermost wiring layer; and the other semiconductor chip mounted on the other surface side of the core layer and electrically connected to the wiring substrate.

11. The wiring substrate as claimed in claim 1, wherein a part of another insulating layer is formed in the recess parts in positions that are opposite to the first insulating layer from the plan view.

* * * * *